(12) United States Patent
Feler

(10) Patent No.: US 11,604,149 B2
(45) Date of Patent: Mar. 14, 2023

(54) METROLOGY METHODS AND OPTICAL SCHEMES FOR MEASUREMENT OF MISREGISTRATION BY USING HATCHED TARGET DESIGNS

(71) Applicant: KLA Corporation, Milpitas, CA (US)

(72) Inventor: Yoel Feler, Haifa (IL)

(73) Assignee: KLA Corporation, Milpitas, CA (US)

( * ) Notice: Subject to any disclaimer, the term of this patent is extended or adjusted under 35 U.S.C. 154(b) by 248 days.

(21) Appl. No.: 17/142,934

(22) Filed: Jan. 6, 2021

(65) Prior Publication Data

US 2021/0333218 A1    Oct. 28, 2021

Related U.S. Application Data

(60) Provisional application No. 63/014,131, filed on Apr. 23, 2020.

(51) Int. Cl.
*G01N 21/88* (2006.01)
*G01N 21/95* (2006.01)

(52) U.S. Cl.
CPC ..... *G01N 21/8851* (2013.01); *G01N 21/9501* (2013.01); *G01N 2021/8887* (2013.01); *G01N 2201/0635* (2013.01)

(58) Field of Classification Search
CPC .......... G01N 21/8851; G01N 21/9501; G01N 2021/8887; G01N 2201/0635
See application file for complete search history.

(56) References Cited

U.S. PATENT DOCUMENTS

| | | | |
|---|---|---|---|
| 7,181,057 B2 | 2/2007 | Adel et al. | |
| 7,440,105 B2 | 10/2008 | Adel et al. | |
| 7,671,990 B1 | 3/2010 | Adel et al. | |
| 10,197,389 B2 | 2/2019 | Levinski et al. | |
| 2013/0278942 A1 | 10/2013 | Jeong et al. | |
| 2018/0172514 A1 | 6/2018 | Wu et al. | |
| 2019/0310080 A1* | 10/2019 | Hill | G03F 7/70633 |
| 2020/0132446 A1 | 4/2020 | Shalibo et al. | |

FOREIGN PATENT DOCUMENTS

| | | |
|---|---|---|
| EP | 3611567 A2 | 2/2020 |
| WO | 2019139685 A1 | 7/2019 |

OTHER PUBLICATIONS https://en.wikipedia.org/wiki/Moiré_pattern, 13 pages.
PCT International Search Report and Written Opinion for International Application No. PCT/US2021/08518 dated Aug. 11, 2021, 11 pages.

* cited by examiner

*Primary Examiner* — Jamil Ahmed
(74) *Attorney, Agent, or Firm* — Suiter Swantz pc llo

(57) ABSTRACT

A metrology system configured to measure overlay errors on a sample is disclosed. The metrology system measures overlay error on the sample in a first direction and/or a second direction simultaneously or sequentially. The metrology system comprises an illumination sub-system configured to illuminate a hatched overlay target on the sample with one or more illumination lobes. The metrology system further comprises an objective lens and a detector at an image plane configured to image the hatched overlay target. A controller is configured to direct illumination source to generate the illumination lobes, receive images of the hatched overlay target, and calculate the overlay errors between a first layer of the sample and a second layer of the sample.

57 Claims, 21 Drawing Sheets

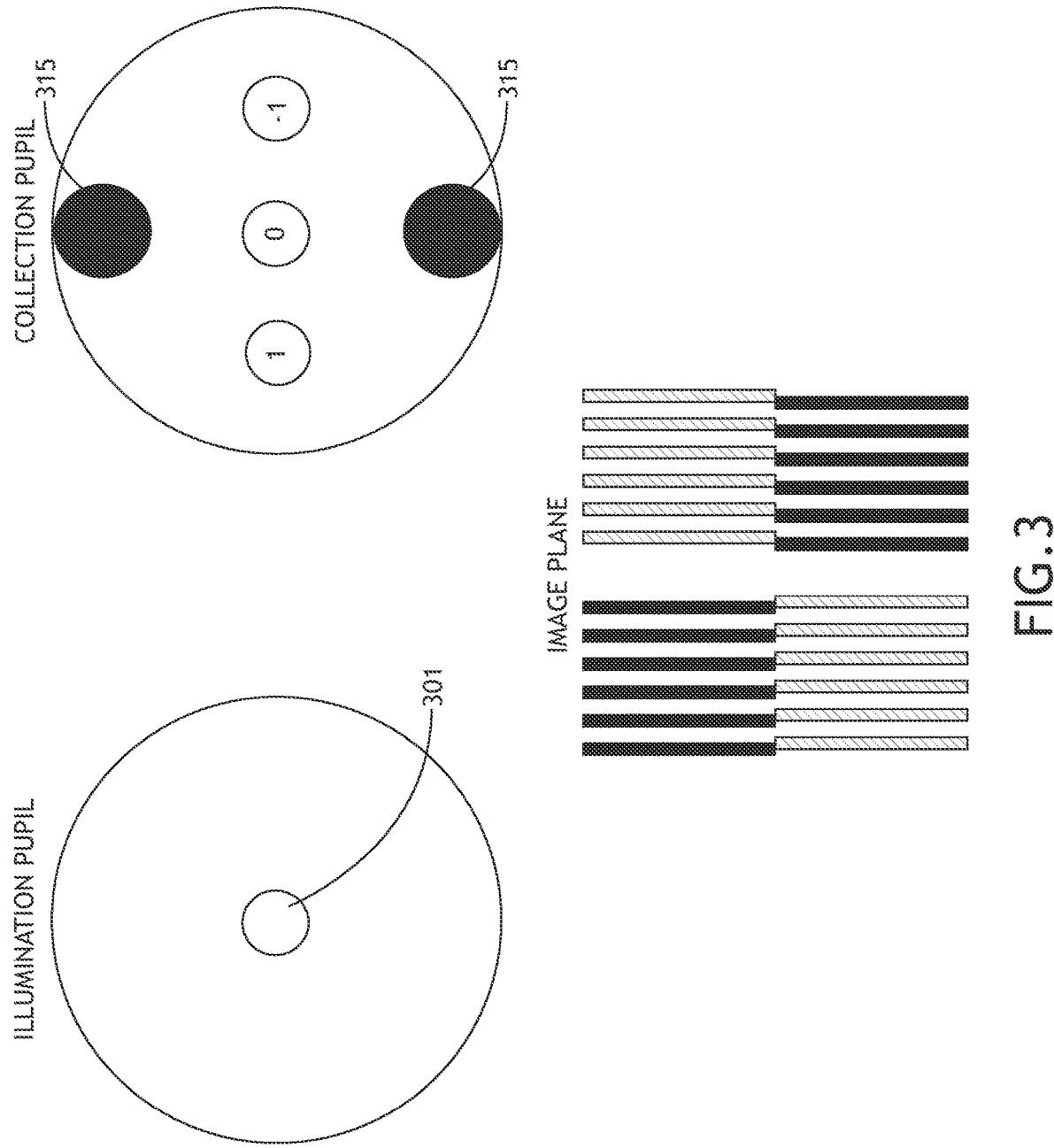

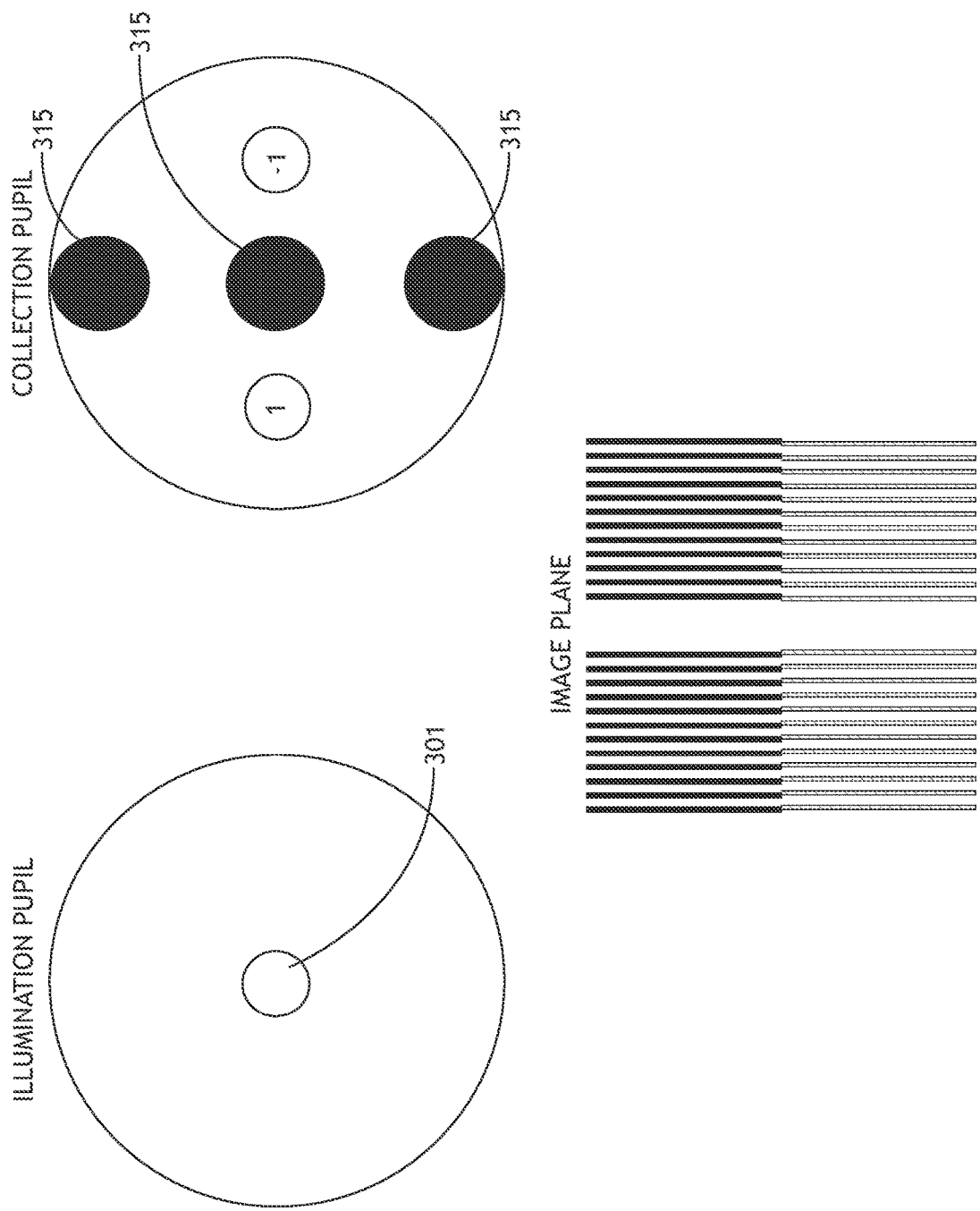

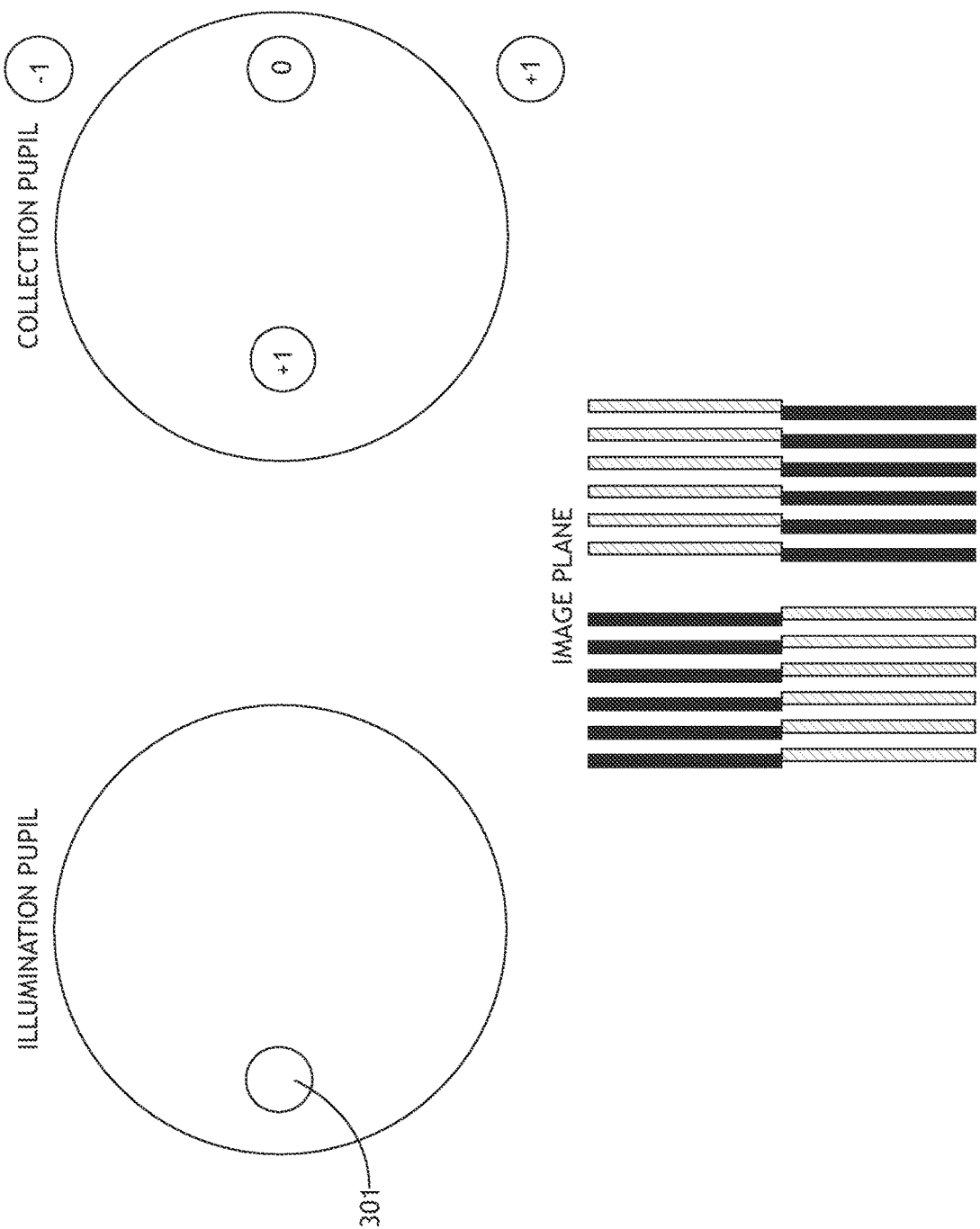

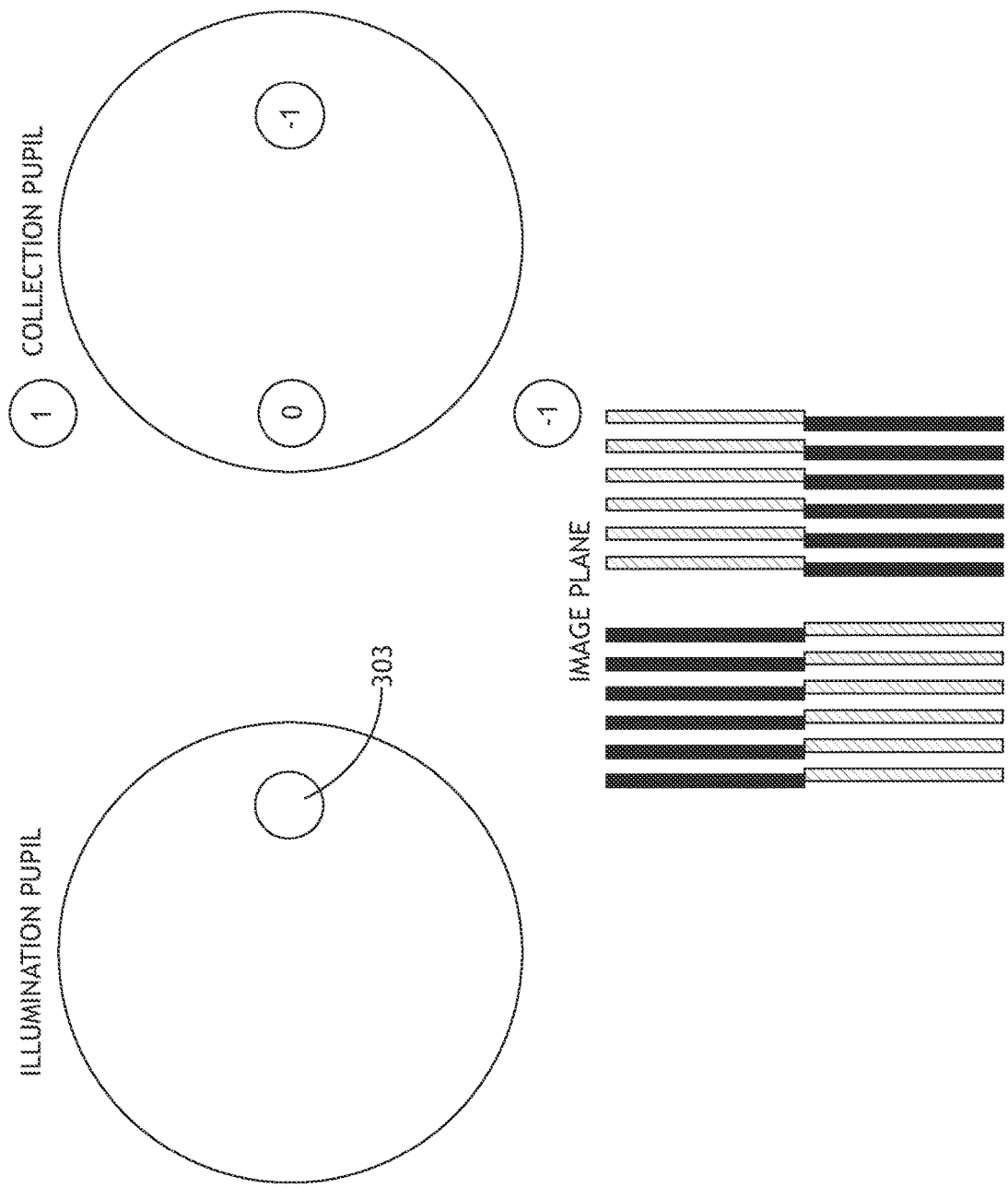

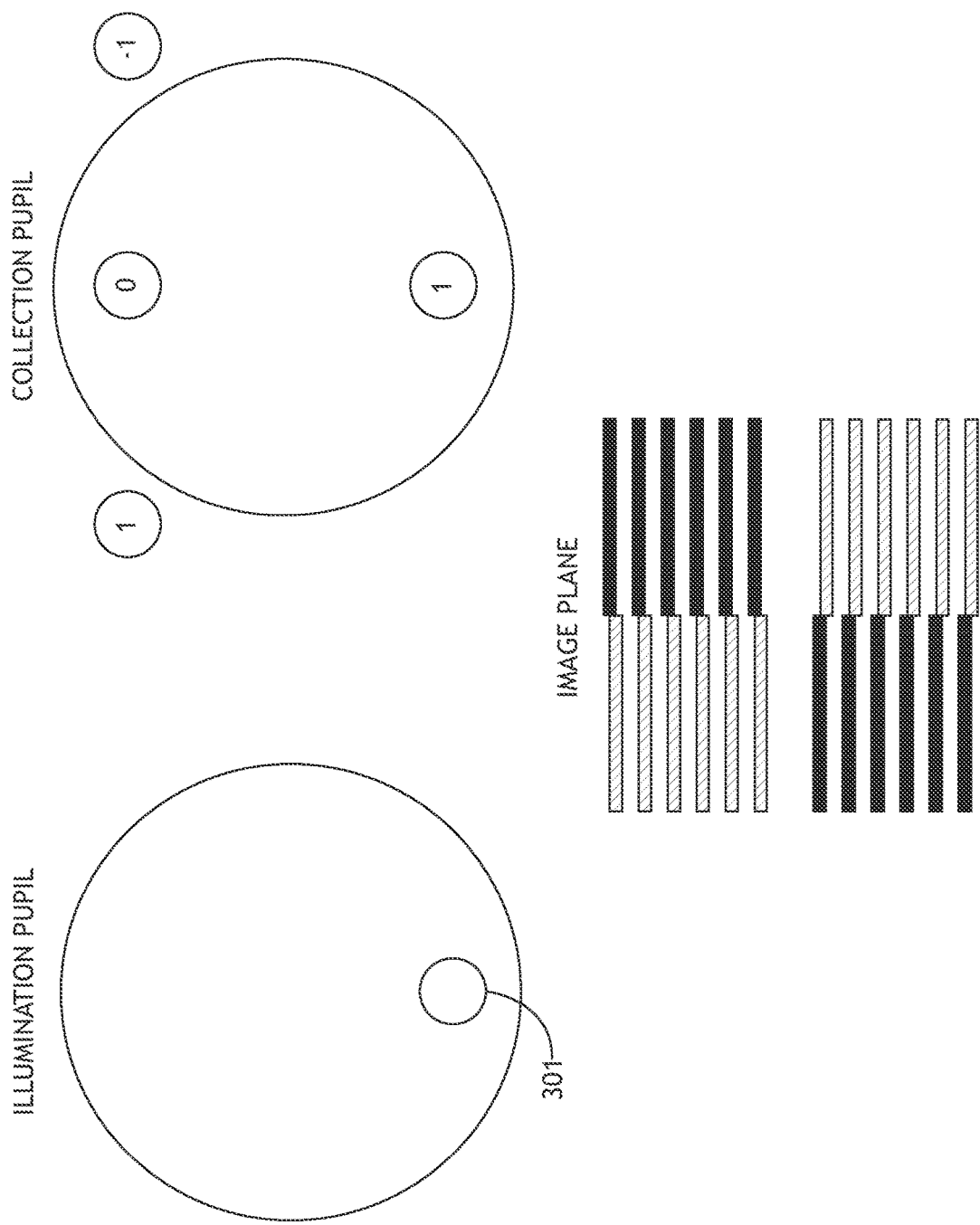

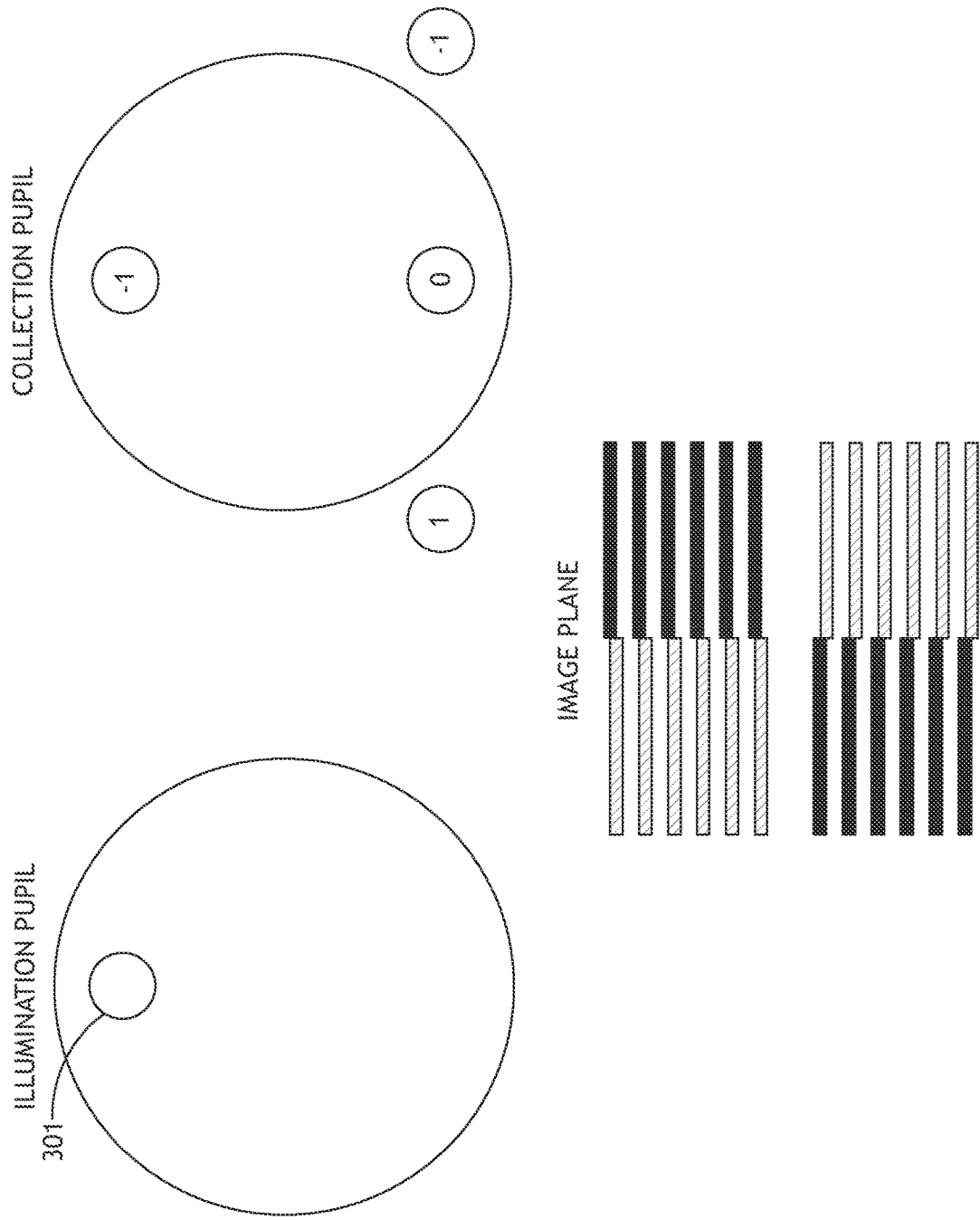

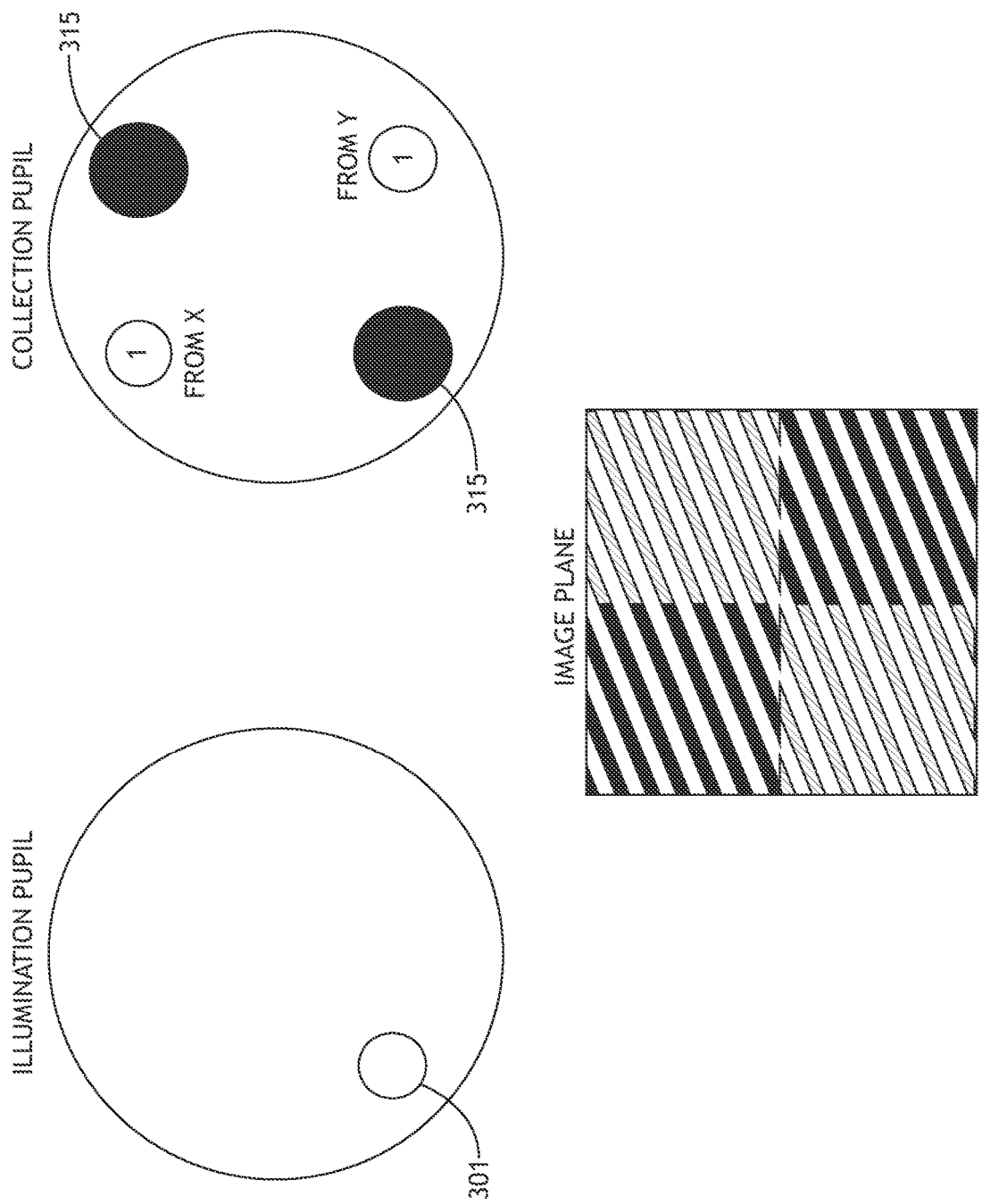

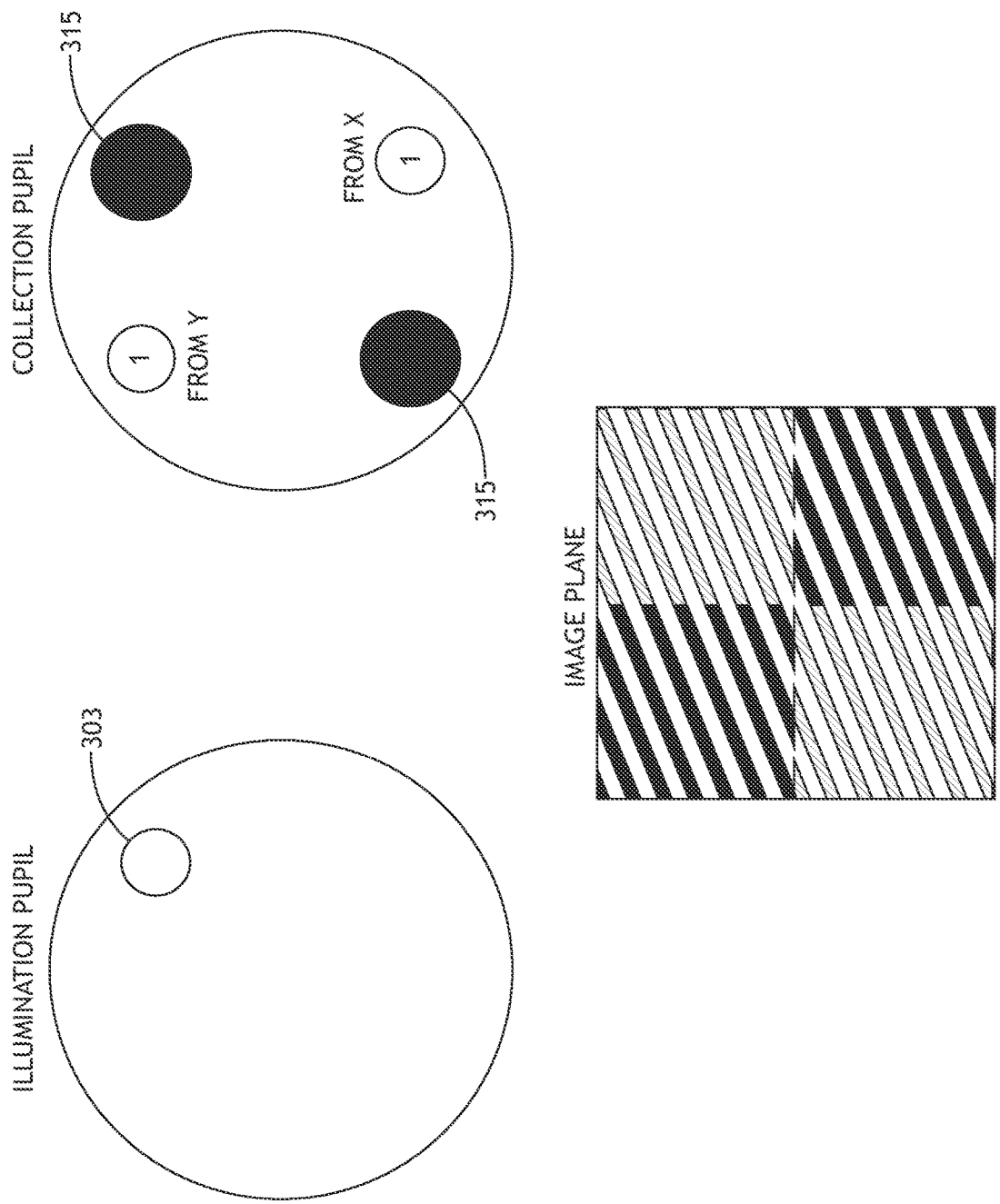

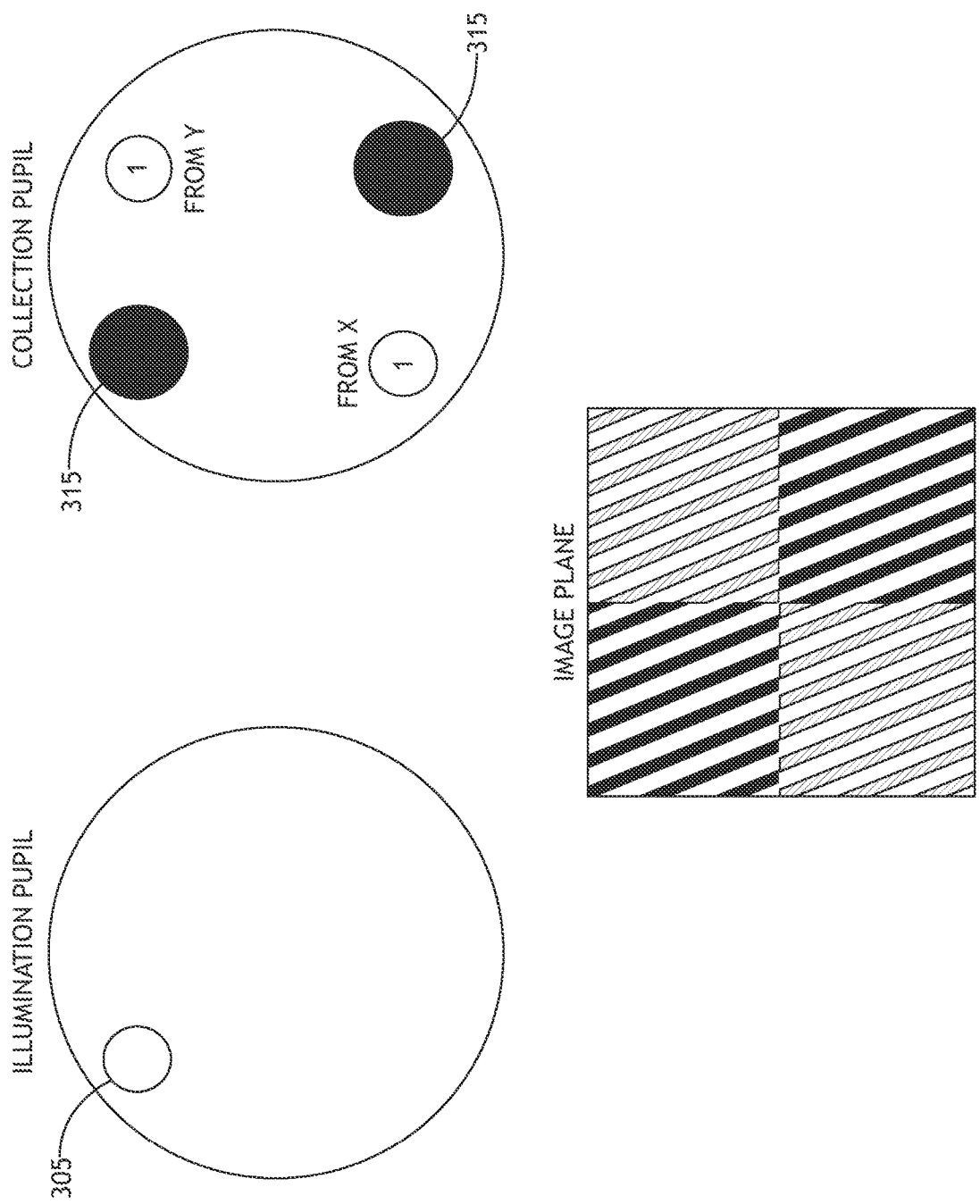

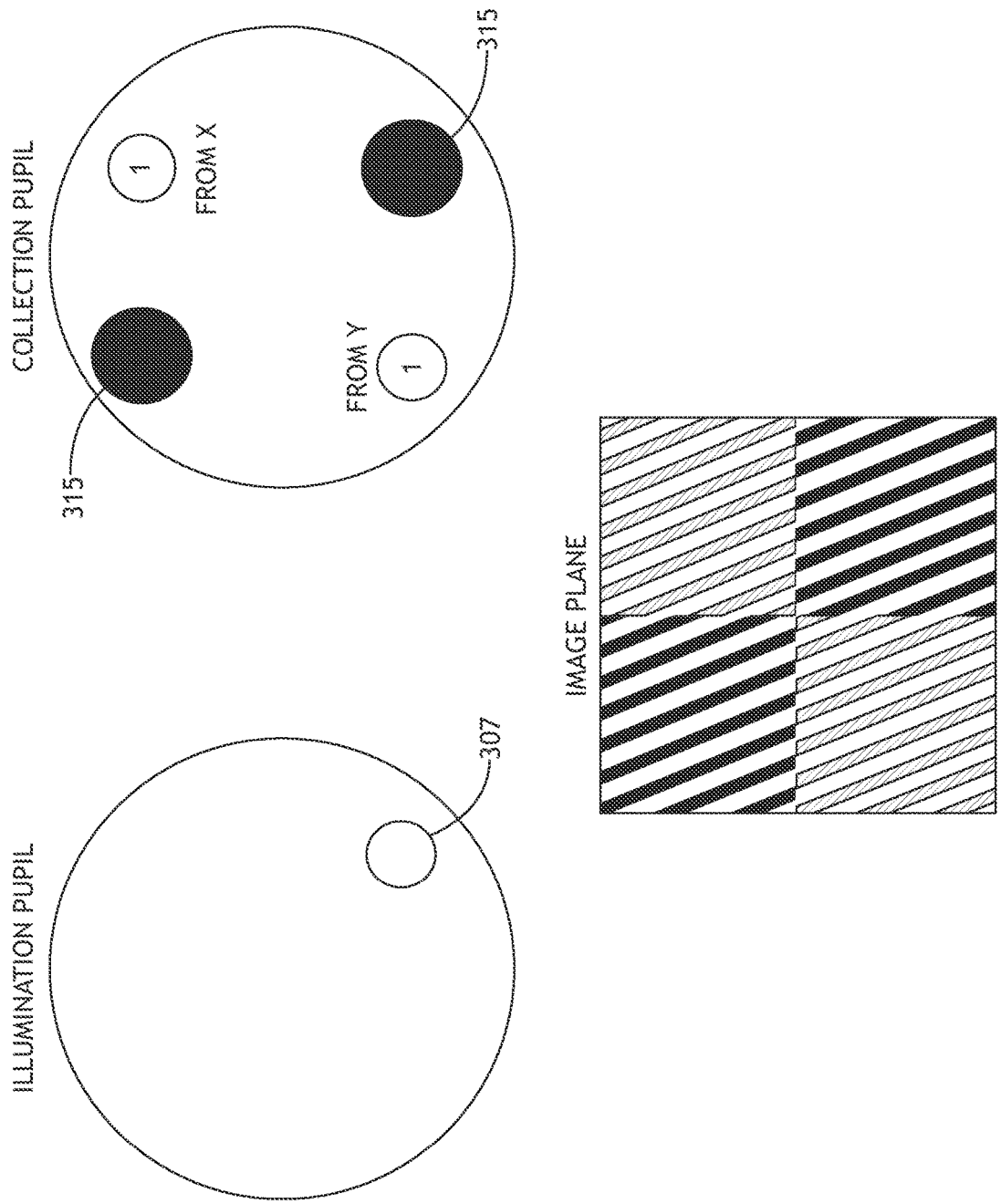

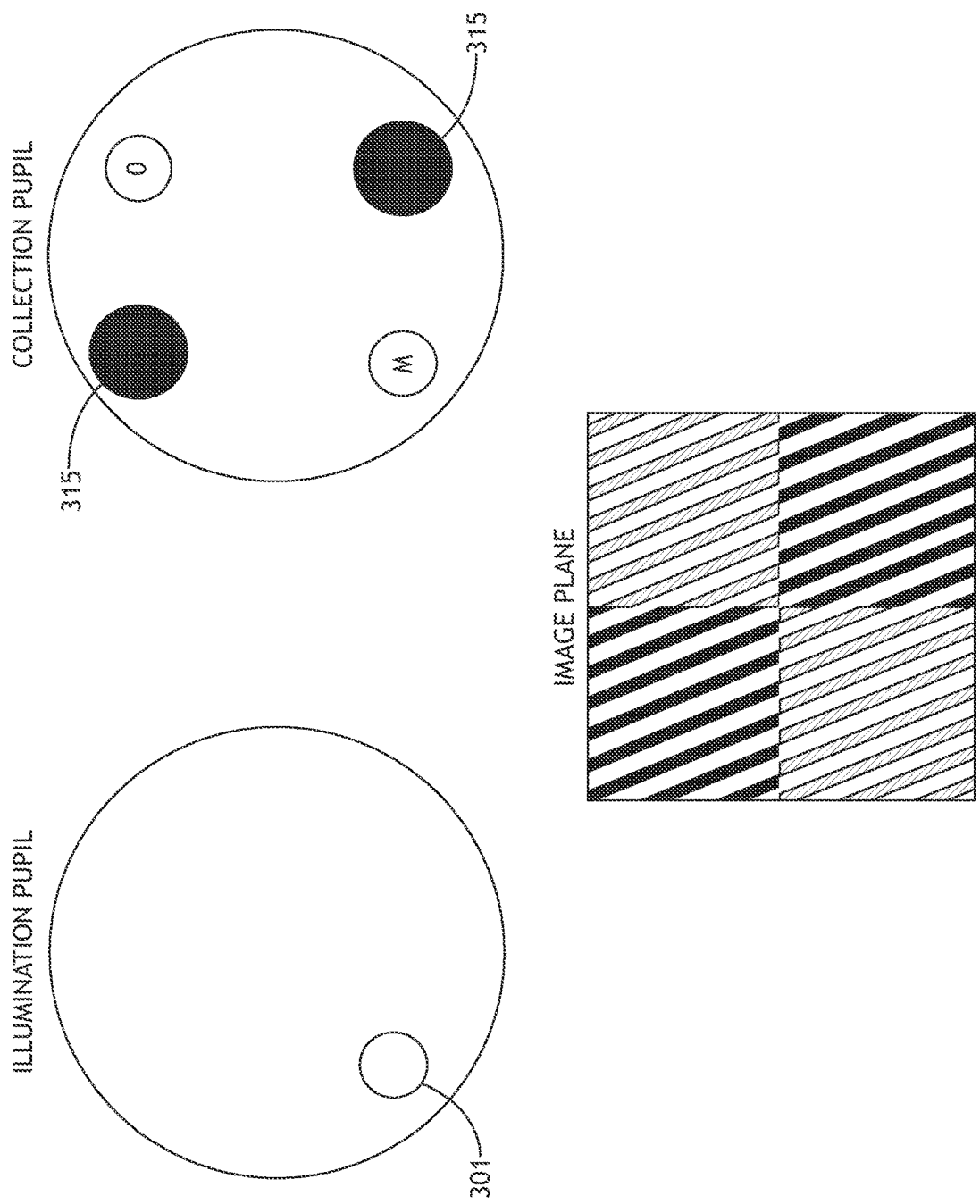

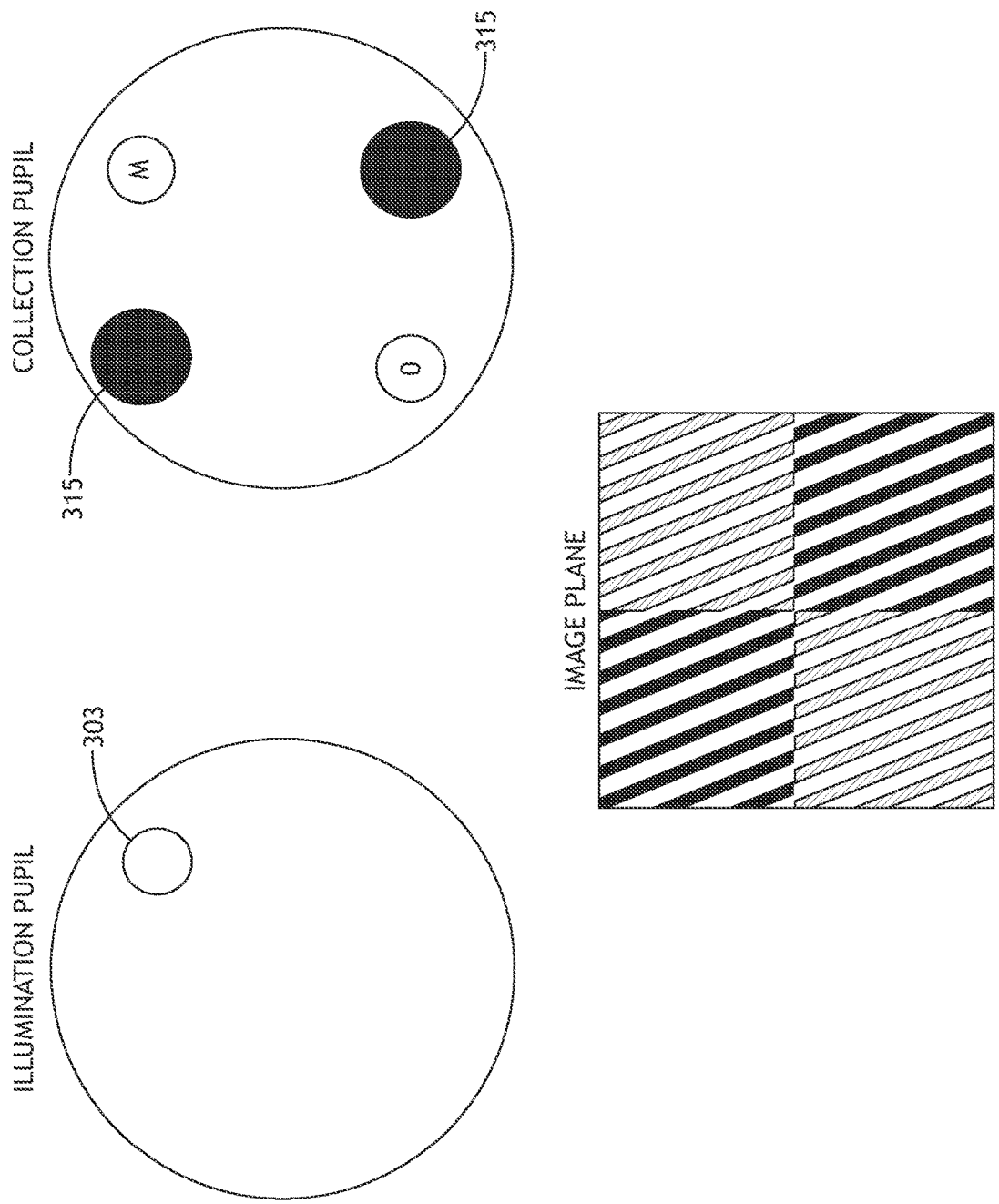

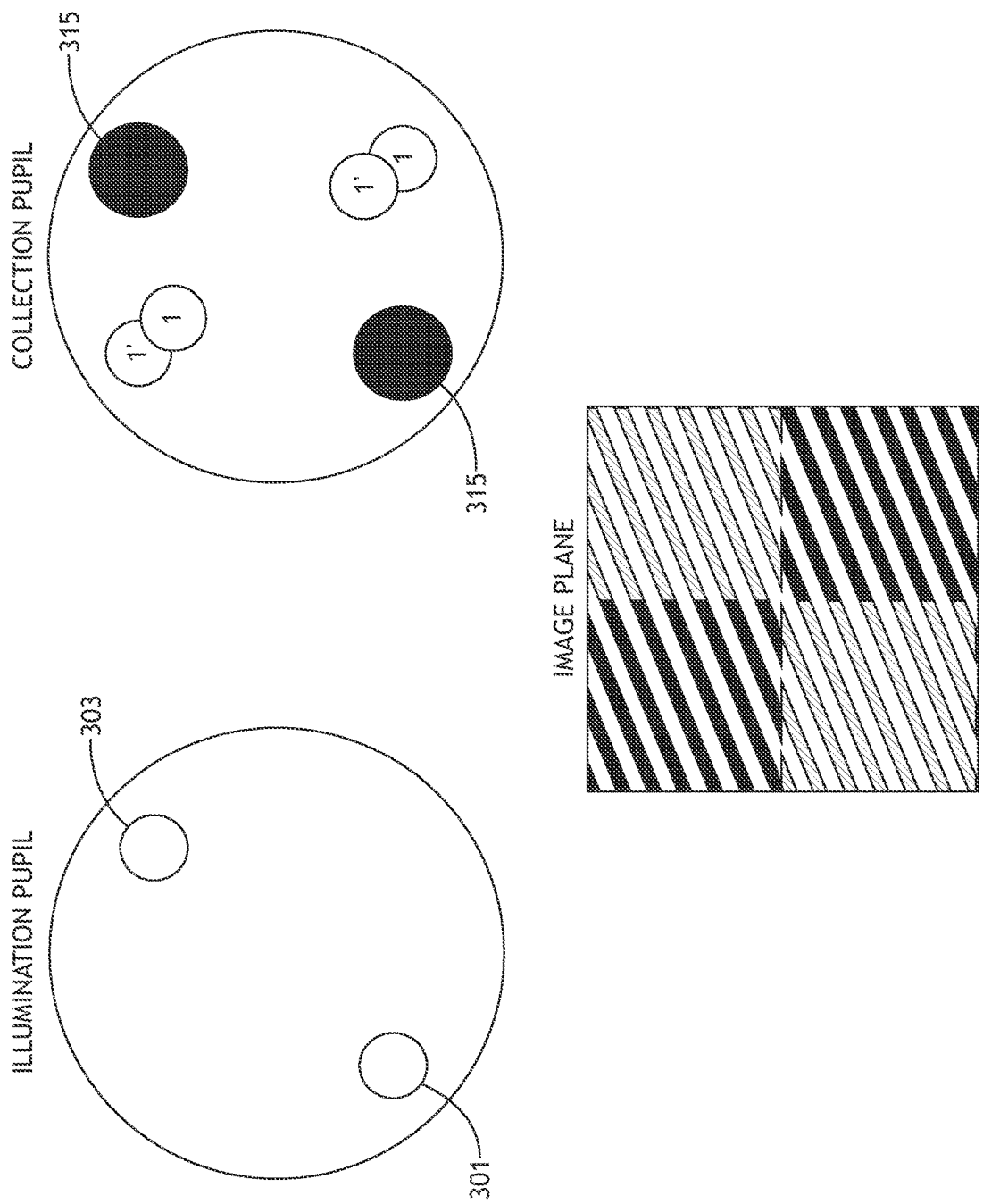

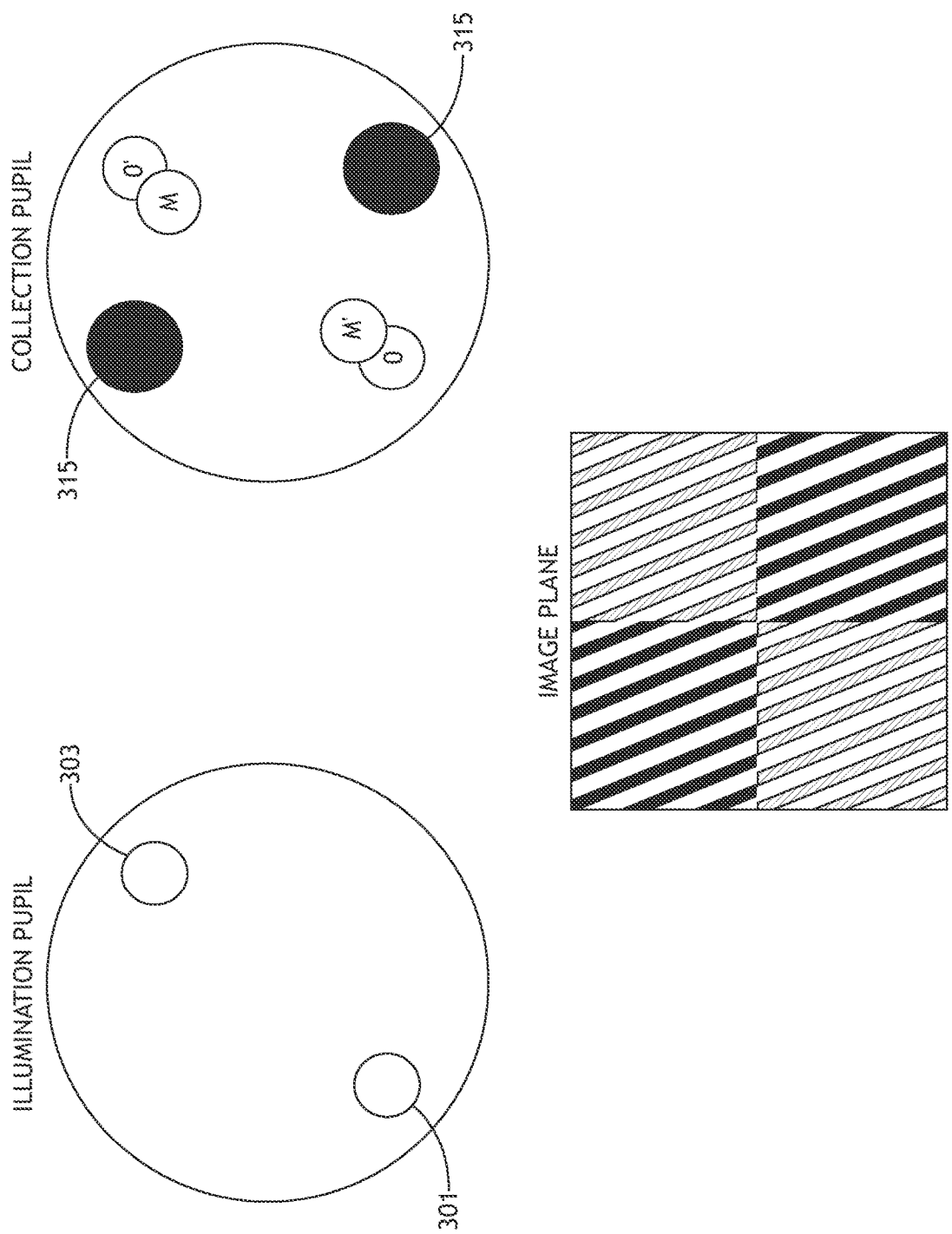

METROLOGY METHODS AND OPTICAL SCHEMES FOR MEASUREMENT OF MISREGISTRATION BY USING HATCHED TARGET DESIGNS

CROSS-REFERENCE TO RELATED APPLICATION

The present application claims the benefit under 35 U.S.C. § 119(e) of U.S. Provisional Application Ser. No. 63/014,131 filed Apr. 23, 2020, entitled METROLOGY METHODS AND OPTICAL SCHEMES FOR MEASUREMENT OF THE MISREGISTRATION BY USING HATCHED TARGET DESIGN, naming Yoel Feler as an inventor, which is incorporated herein by reference in the entirety.

TECHNICAL FIELD

The present disclosure relates generally to imaging overlay metrology and, more particularly, to imaging overlay targets with hatched elements.

BACKGROUND

Shrinking design rules and more demanding specifications for overlay metrology are driving increased demands for the sensitivity and robustness of overlay metrology methods. Overlay metrology is typically performed by fabricating dedicated metrology targets having fabricated features in multiple layers of interest on a sample (e.g., a semiconductor wafer or a photomask). Accordingly, an analysis of a fabricated metrology target may provide a measurement of the overlay error (e.g., relative alignment error) between the sample layers of interest. While a wide variety of overlay metrology target designs have been proposed, there is a continuous need to improve the metrology target designs as well as measurement methods for accurately and efficiently analyzing fabricated metrology targets.

SUMMARY

A metrology system is disclosed in accordance with one or more illustrative embodiments of the present disclosure. In one illustrative embodiment, the metrology system comprises an illumination sub-system configured to direct an illumination lobe from an illumination source to a hatched overlay target on a sample at a normal incidence angle. The hatched overlay target includes first-direction gratings having a periodicity along a first direction and second-direction gratings having a periodicity along a second direction different than the first direction. The hatched overlay target comprises: a first set of cells, each including at least one of the first-direction gratings in a first layer of the sample and at least one of the second-direction gratings in a second layer of the sample overlapping the first-direction gratings; and a second set of cells, each including at least one of the second-direction gratings in the first layer of the sample and at least one of the first-direction gratings in the second layer of the sample overlapping the second-direction gratings. In another illustrative embodiment, the metrology system comprises an imaging sub-system comprising: a pupil mask located in a pupil plane, wherein a first configuration of the pupil mask passes first-order diffraction along the first direction and blocks non-zero diffraction along the second direction; and a detector located at a field plane configured to image the hatched overlay target based on diffraction orders passed by the pupil mask. In another illustrative embodiment, the metrology system comprises a controller communicatively couplable to the imaging sub-system, the controller including one or more processors configured to execute program instructions causing the one or more processors to: direct the pupil mask to configure according to the first configuration; receive a first-direction image of hatched overlay target from the detector based on the diffraction orders passed by the pupil mask in the first configuration, wherein the first-direction gratings are at least partially resolved and the second-direction gratings are unresolved in the first-direction image; and determine an overlay measurement associated with the relative positions of the first and second layers of the sample along the first direction based on the first-direction image.

A metrology system is disclosed in accordance with one or more illustrative embodiments of the present disclosure. In one illustrative embodiment, the metrology system comprises an illumination sub-system configured to selectively direct illumination from an illumination source to a hatched overlay target on a sample. The hatched overlay target includes first-direction gratings having a periodicity along a first direction and second-direction gratings having a periodicity along a second direction different than the first direction. The illumination includes at least one illumination lobe oriented to illuminate the sample at an oblique angle. The hatched overlay target comprises: a first set of cells, each including at least one of the first-direction gratings in a first layer of the sample and at least one of the second-direction gratings in a second layer of the sample overlapping the first-direction gratings; and a second set of cells, each including at least one of the second-direction gratings in the first layer of the sample and at least one of the first-direction gratings in the second layer of the sample overlapping the second-direction gratings. In another illustrative embodiment, the metrology system comprises an imaging sub-system including a detector located at a field plane configured to image the hatched overlay target. In another illustrative embodiment, the metrology system comprises a controller communicatively couplable to the imaging sub-system, the controller including one or more processors configured to execute program instructions causing the one or more processors to: receive one or more first-direction images of the hatched overlay target based on two symmetrically-opposed illumination lobes along the first direction from the illumination source, wherein a collection pupil of the imaging sub-system includes 0-order diffraction and a first-order diffraction beam from each of the two symmetrically-opposed illumination lobes along the first direction, wherein non-zero diffraction along the second direction is outside the collection pupil; and determine an overlay measurement associated with the relative positions of the first and second layers of the sample along the first direction based on the one or more first-direction images.

A metrology system is disclosed in accordance with one or more illustrative embodiments of the present disclosure. In one illustrative embodiment, the metrology system comprises an illumination sub-system configured to selectively direct illumination from an illumination source to a hatched overlay target on a sample. The hatched overlay target includes first-direction gratings having a periodicity along a first direction and second-direction gratings having a periodicity along a second direction different than the first direction, and the illumination includes at least one illumination lobe oriented to illuminate the sample along at least one direction different than the first or second directions. The hatched overlay target comprises a first set of cells, each including at least one of the plurality of first-direction gratings in a first layer of the sample and at least one of the plurality of second-direction gratings in a second layer of the sample overlapping the first-direction gratings, and a second set of cells, each including at least one of the plurality of second-direction gratings in the first layer of the sample and at least one of the plurality of first-direction gratings in the second layer of the sample overlapping the second-direction gratings. In another illustrative embodiment, the metrology system comprises a detector located at an image plane to image the hatched overlay target, a pupil mask configured to pass selected diffraction orders associated with diffraction of the illumination by the hatched overlay target. Images of the hatched overlay target generated by the detector based on the selected diffraction orders include Moiré patterns in locations of the first and second sets of cells that are periodic along one or more Moiré grating directions different than the first or second directions. In another illustrative embodiment, the metrology system comprises a controller communicatively couplable to the detector and the pupil mask. The controller includes one or more processors configured to execute program instructions causing the one or more processors to determine overlay measurements associated with relative positions of the first and second layers of the sample along the first and second directions based on the Moiré patterns in one or more images of the hatched overlay target.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 3 illustrates a one-step centric configuration for sample illumination and collection using a hatched overlay target, in accordance with one or more embodiments of the present disclosure.

FIG. 4 illustrates a one-step centric configuration for sample illumination and collection, in accordance with one or more embodiments of the present disclosure.

FIGS. 6A and 6B illustrate a two-step off-center configuration for sample illumination and collection, in accordance with one or more embodiments of the present disclosure.

FIGS. 7A and 7B illustrate a two-step off-center configuration for sample illumination and collection, in accordance with one or more embodiments of the present disclosure.

FIGS. 8A-8D illustrate a four-step off-center tilted configuration for sample illumination and collection, in accordance with one or more embodiments of the present disclosure.

FIGS. 10A and 10B illustrate an alternative configuration for the steps shown in FIGS. 8C and 8D, in accordance with one or more embodiments of the present disclosure.

FIGS. 11A and 11B illustrate alternative configurations for the steps shown in FIGS. 8A-8D, in accordance with one or more embodiments of the present disclosure.

FIG. 12 illustrates an alternative configuration for the second step shown in FIG. 11B, in accordance with one or more embodiments of the present disclosure.

DETAILED DESCRIPTION

Figure 1:
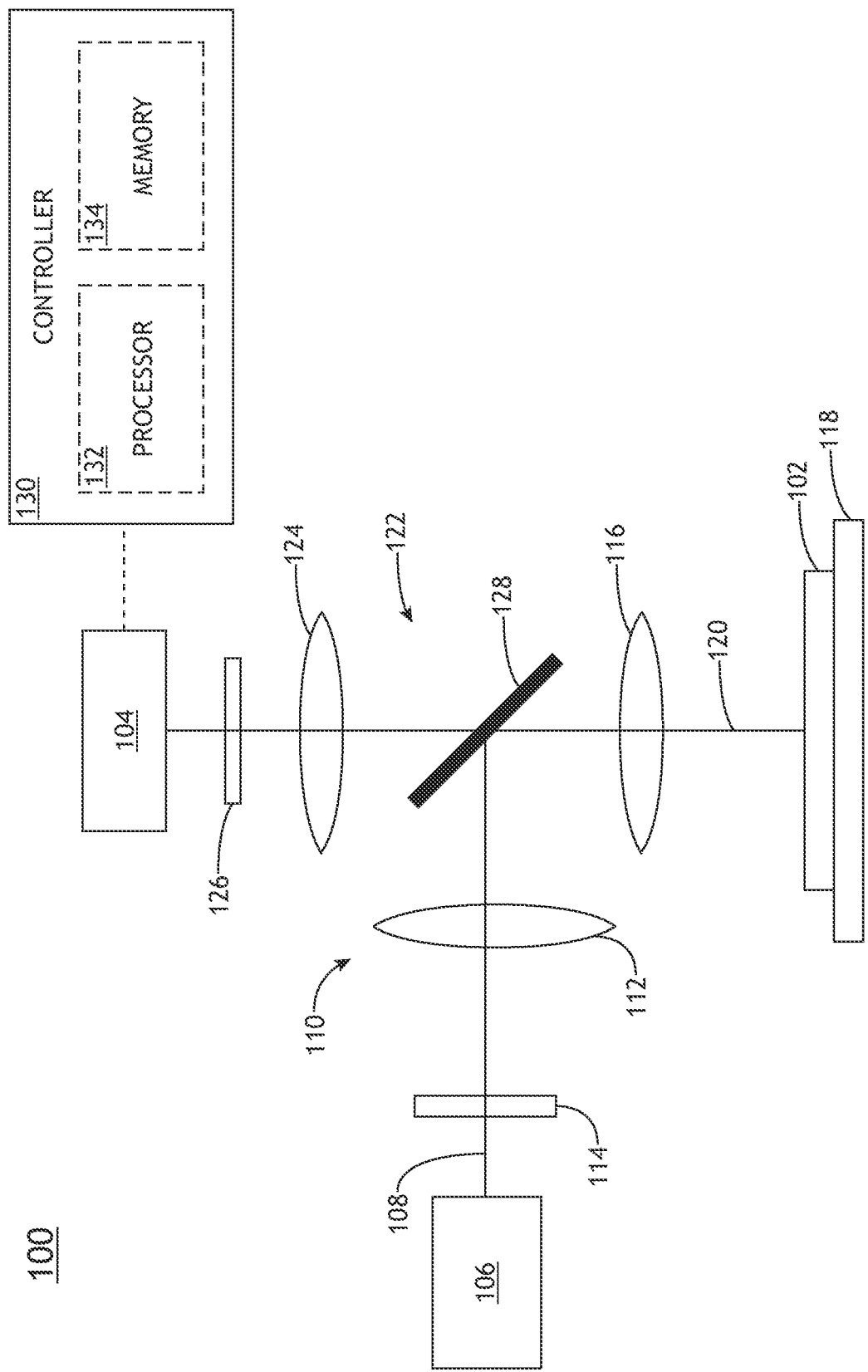
FIG. 1 is a block diagram view of a metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. As used herein, directional terms such as "left," "right," "top," "bottom," "over," "under," "upper," "upward," "lower," "down," "downward," "horizontal," and "vertical," are intended to provide relative positions for purposes of description, and are not intended to designate an absolute frame of reference. Additionally, the terms "compute," "calculate," "determine," and "generate" may be construed interchangeably. It should be readily apparent to those of ordinary skill in the art that various changes and modifications in form and detail may be made without departing from the spirit and scope of the disclosure.

The present disclosure is directed to measuring overlay error between layers of a sample (e.g., a semiconductor wafer or a photomask) using hatched overlay targets (e.g., metrology targets having hatched patterns). The overlay error may be measured in first direction (e.g., a horizontal or X-direction) and/or a second direction (e.g., a vertical or Y-direction). The measurement may be performed by placing a collection camera (e.g., image detector) in a field plane (e.g., image plane) to capture image(s) of the hatched overlay target on the sample.

Major techniques for overlay error measurement include imaging, scatterometry and scanning electron microscopy (SEM). A common optical architecture is centrally illuminated regular imaging, and a common overlay target design is a "side-by-side" periodic target design (e.g., AIM® targets; registered trademark of KLA Corporation, Milpitas, Calif.). Several disadvantages are apparent when performing conventional imaging techniques. One disadvantage is the requirement of large exclusion zones in the overlay target to prevent cross talk between different parts of the target. Another disadvantage is the divergence of the design of the target from actual device structures (e.g., random access memory [RAM] structures). Furthermore, hatched targets configured for X-direction and Y-direction overlay measurements, which are described in U.S. Pat. No. 7,671,990 (incorporated herein by reference in its entirety), may not provide accurate measurements since cross talk (e.g., at the level of the image) may occur between the X-direction and Y-direction gratings.

A hatched overlay target may include cells (i.e., quadrants) having a hatched pattern. Each cell of the overlay target may comprise at least two different layers of grating structures, where first-direction grating structures are periodic along a first direction (e.g., the X-direction) on a first layer of the sample and second-layer grating structures are periodic along a second direction (e.g., the Y-direction) on a second layer of the sample, or vice versa. Embodiments of the present disclosure may improve the measurement of hatched targets and may alleviate several major problems.

A first problem is related to target size (i.e., area on a sample). Conventional metrology targets include a relatively large number of exclusion zones which cover a significant area on the target. In contrast, hatched targets may require fewer exclusion zones. Additionally, conventional metrology targets may include grating structures having large periodicities (e.g., the distance between gratings in a grating structure) which require large target sizes (otherwise, the target may be non-periodic and may be less process compatible). Special illumination schemes for hatched targets may thus enable smaller metrology targets.

A second problem is related to the contrast difference between layers of an overlay target, which a Moiré pattern technique may alleviate (described with respect to FIGS. 8A-12). A Moiré pattern may appear in the collected image due to the differences in directions of the grating structures and the resulting interference of Moiré diffraction orders (e.g., first order diffraction).

A third problem is related to process compatibility. Hatched grating-over-grating structures may be more process compatible (i.e., increase the accuracy of an overlay measurement provided by an overlay target with respect to a particular device structure). Hatched overlay targets may be more process-compatible especially when using cut-to-active measurement schemes where the structures more closely resemble actual device structures (in contrast to grating side-by-side, regular Moiré, or scatterometry overlay (SCOL) target designs which may deviate too far from the actual device structures).

It is contemplated herein that a hatched overlay target (or a cell thereof) may generally diffract incident illumination (e.g., an incident illumination lobe having a narrow range of incidence angles) into discrete diffraction orders along both the first and second directions. The distribution of the diffraction orders along a given direction may generally be controlled by a metrology recipe defining factors associated with the target or the overlay metrology system such as, but not limited to, the pitch along the first and second directions, a line/space ratio of target features, a wavelength of incident illumination, an incidence angle of illumination, or a numerical aperture of an imaging system.

It is further contemplated herein that an image of a hatched overlay target (or a cell thereof) may be influenced by controlling the distribution of diffraction orders from the target that form the basis of the image. For example, the metrology recipe may be designed to provide for the collection of certain diffraction orders. Further, selected diffraction orders may be blocked in a collection pupil by a pupil mask.

In some embodiments, a hatched overlay target is imaged under conditions that provide that only grating structures along a particular measurement direction are resolved in the image. For example, forming an image of the hatched overlay target based on two or more diffraction orders along the first direction (e.g., non-zero diffraction orders along the second direction are blocked or not collected) may result in only the first-direction grating structures being resolved in the image (or at least partially resolved). Such an image may be referred to as a first-direction image herein. By arranging the hatched overlay target to have a first set of cells with first-direction grating structures on a first sample layer and a second set of cells with first-direction grating structures on a second sample layer, an overlay measurement between the first and second sample layers may be generated using any suitable technique. As a non-limiting example, an overlay error along the first direction may be proportional to a difference between centers of symmetry of the first and second sets of cells in the image along the first direction. Similar overlay measurements may also be made using on an image of the hatched overlay target based on two or more diffraction orders along the second direction (e.g., non-zero diffraction orders along the first direction are blocked or not collected). Such an image may be referred to as a second-direction image herein.

Additionally, it is contemplated herein that different overlay algorithms for generating an overlay measurement may utilize different numbers of images based on the illumination conditions. In some embodiments, an overlay measurement along a particular measurement direction (e.g., a first direction or a second direction) is based on a single image formed from illumination at a normal incidence angle. In some embodiments, an overlay measurement along a particular measurement direction is based on one or more images formed from illumination with symmetrically opposed illumination lobes.

In some embodiments, a hatched overlay target is imaged under conditions in which Moiré patterns are visible rather than the grating-over-grating features themselves. For example, Moiré patterns may have a periodicity oriented along a Moiré grating direction that is diagonal with respect to the first and second directions and is related to the period of the first-direction and second-direction grating structures in a particular region. By generating images in which Moiré patterns are visible along two different (e.g., orthogonal) Moiré grating directions, a 2D overlay measurement is possible.

FIG. 1 is a block diagram view of a metrology system 100, in accordance with one or more embodiments of the present disclosure. The metrology system 100 may generate one or more images of a sample 102 on at least one detector 104 using any method known in the art.

In one embodiment, the metrology system 100 includes an illumination source 106 configured to generate an illumination beam 108 (e.g., one or more illumination lobes). The illumination beam 108 may include one or more selected wavelengths of light including, but not limited to, vacuum ultraviolet radiation (VUV), deep ultraviolet radiation (DUV), ultraviolet (UV) radiation, visible radiation, or infrared (IR) radiation. The illumination source 106 may further generate an illumination beam 108 including any range of selected wavelengths. In another embodiment, the illumination source 106 may include a spectrally-tunable illumination source to generate an illumination beam 108 having a tunable spectrum. It is noted that the illumination beam 108 may be shaped into one or more illumination lobes using a mask placed in front of the illumination source 106. In this way, the placement of the illumination lobes on the sample 102 may be controlled (for example, the illumination lobes may be directed to particular quadrants or cells of a metrology target).

The illumination source 106 may further produce an illumination beam 108 having any temporal profile. For example, the illumination source 106 may produce a continuous illumination beam 108, a pulsed illumination beam 108, or a modulated illumination beam 108. Additionally, the illumination beam 108 may be delivered from the illumination source 106 via free-space propagation or guided light (e.g. an optical fiber, a light pipe, or the like).

In some embodiments, the illumination beam 108 may comprise incoherent light. In other embodiments, the illumination beam 108 may comprise coherent light.

In another embodiment, the illumination beam 108 is directed to a sample 102 via an illumination pathway 110. The illumination pathway 110 may include one or more lenses 112 or additional illumination optical components 114 suitable for modifying and/or conditioning the illumination beam 108. For example, the one or more illumination optical components 114 may include, but are not limited to, one or more polarizers, one or more filters, one or more beam splitters, one or more diffusers, one or more homogenizers, one or more apodizers, one or more beam shapers, or one or more shutters (e.g., mechanical shutters, electro-optical shutters, acousto-optical shutters, or the like). By way of another example, the one or more illumination optical components 114 may include aperture stops to control the angle of illumination on the sample 102 and/or field stops to control the spatial extent of illumination on the sample 102. In one instance, the illumination pathway 110 includes an aperture stop located at a plane conjugate to the back focal plane of the objective lens 116 to provide telecentric illumination of the sample. In another embodiment, the metrology system 100 includes an objective lens 116 to focus the illumination beam 108 onto the sample 102.

In another embodiment, the sample 102 is disposed on a sample stage 118. The sample stage 118 may include any device suitable for positioning the sample 102 within the metrology system 100. For example, the sample stage 118 may include any combination of linear translation stages, rotational stages, tip/tilt stages or the like.

In another embodiment, a detector 104 is configured to capture radiation emanating from the sample 102 (e.g., sample light 120) through a collection pathway 122. For example, the collection pathway 122 may include, but is not required to include, a collection lens (e.g. the objective lens 116 as illustrated in FIG. 1) or one or more additional collection pathway lenses 124. In this regard, a detector 104 may receive radiation reflected or scattered (e.g. via specular reflection, diffuse reflection, and the like) from the sample 102 or generated by the sample 102 (e.g. luminescence associated with absorption of the illumination beam 108, or the like).

The collection pathway 122 may further include any number of collection optical components 126 to direct and/or modify illumination collected by the objective lens 116 including, but not limited to one or more collection pathway lenses 124, one or more filters, one or more polarizers, or one or more beam blocks. Additionally, the collection pathway 122 may include field stops to control the spatial extent of the sample imaged onto the detector 104 or aperture stops to control the angular extent of illumination from the sample used to generate an image on the detector 104. In another embodiment, the collection pathway 122 includes an aperture stop located in a plane conjugate to the back focal plane of an optical element the objective lens 116 to provide telecentric imaging of the sample.

The detector 104 may include any type of optical detector known in the art suitable for collecting illumination from the sample 102. For example, a detector 104 may include a sensor suitable for generating one or more images of a static sample 102 (e.g., in a static mode of operation) such as, but is not limited to, a charge-coupled device (CCD), a complementary metal-oxide-semiconductor (CMOS) sensor, a photomultiplier tube (PMT) array, or an avalanche photodiode (APD) array. Further, the detector 104 may include a multi-tap sensor having two or more taps per pixel including, but not limited to, a multi-tap CMOS sensor. In this regard, charge in a multi-tap pixel may be directed to any selected tap during an exposure window based on one or more drive signals to the pixel. Accordingly, a multi-tap sensor including an array of multi-tap pixels may generate multiple images, each associated with different taps of the associated pixels, during a single readout phase. Further, for the purposes of the present disclosure, a tap of a multi-tap sensor may refer to an output tap connected to the associated pixels. In this regard, reading out each tap of a multi-tap sensor (e.g., in a readout phase) may generate a separate image.

By way of another example, a detector 104 may include a sensor suitable for generating one or more images of a sample 102 in motion (e.g., a scanning mode of operation). For instance, the detector 104 may include a line sensor including a row of pixels. In this regard, the metrology system 100 may generate a continuous image (e.g., a strip image) one row at a time by translating the sample 102 in a scan direction perpendicular to the pixel row through a measurement field of view and continuously clocking the line sensor during a continuous exposure window.

In another instance, the detector 104 may include a TDI sensor including multiple pixel rows and a readout row. The TDI sensor may operate in a similar manner as the line sensor, except that clocking signals may successively move charge from one pixel row to the next until the charge reaches the readout row, where a row of the image is generated. By synchronizing the charge transfer (e.g., based on the clocking signals) to the motion of the sample along the scan direction, charge may continue to build up across the pixel rows to provide a relatively higher signal to noise ratio compared to the line sensor.

In another embodiment, a detector 104 may include a spectroscopic detector suitable for identifying wavelengths of radiation emanating from the sample 102. In another embodiment, the metrology system 100 may include multiple detectors 104 (e.g. associated with multiple beam paths generated by one or more beamsplitters to facilitate multiple metrology measurements by the metrology system 100. For example, the metrology system 100 may include one or more detectors 104 suitable for static mode imaging and one or more detectors 104 suitable for scanning mode imaging. In another embodiment, the metrology system 100 may include one or more detectors 104 suitable for both static and scanning imaging modes.

In one embodiment, as illustrated in FIG. 1, the metrology system 100 includes a beamsplitter 128 oriented such that the objective lens 116 may simultaneously direct the illumination beam 108 to the sample 102 and collect radiation emanating from the sample 102.

In another embodiment, the angle of incidence of the illumination beam 108 on the sample 102 is adjustable. For example, the path of the illumination beam 108 through the beamsplitter 128 and the objective lens 116 may be adjusted to control the angle of incidence of the illumination beam 108 on the sample 102. In this regard, the illumination beam 108 may have a nominal path through the beamsplitter 128 and the objective lens 116 such that the illumination beam 108 has a normal incidence angle on the sample 102. By way of another example, the angle of incidence of the illumination beam 108 on the sample 102 may be controlled by modifying the position and/or angle of the illumination beam 108 on the beamsplitter 128 (e.g. by rotatable mirrors, a spatial light modulator, a free-form illumination source, or the like). In another embodiment, the illumination source 106 directs the one or more illumination beam 108 to the sample 102 at an angle (e.g. a glancing angle, a 45-degree angle, or the like).

In another embodiment, the metrology system 100 includes a controller 130. In another embodiment, the controller 130 includes one or more processors 132 configured to execute program instructions maintained on a memory medium 134. In this regard, the one or more processors 132 of controller 130 may execute any of the various process steps described throughout the present disclosure. Further, the controller 130 may be configured to receive data including, but not limited to, images of the sample 102 from the detector 104.

The one or more processors 132 of a controller 130 may include any processing element known in the art. In this sense, the one or more processors 132 may include any microprocessor-type device configured to execute algorithms and/or instructions. In one embodiment, the one or more processors 132 may consist of a desktop computer, mainframe computer system, workstation, image computer, parallel processor, or any other computer system (e.g., networked computer) configured to execute a program configured to operate the metrology system 100, as described throughout the present disclosure. It is further recognized that the term "processor" may be broadly defined to encompass any device having one or more processing elements, which execute program instructions from a non-transitory memory medium 134. Further, the steps described throughout the present disclosure may be carried out by a single controller 130 or, alternatively, multiple controllers. Additionally, the controller 130 may include one or more controllers housed in a common housing or within multiple housings. In this way, any controller or combination of controllers may be separately packaged as a module suitable for integration into metrology system 100. Further, the controller 130 may analyze data received from the detector 104 and feed the data to additional components within the metrology system 100 or external to the metrology system 100.

The memory medium 134 may include any storage medium known in the art suitable for storing program instructions executable by the associated one or more processors 132. For example, the memory medium 134 may include a non-transitory memory medium. By way of another example, the memory medium 134 may include, but is not limited to, a read-only memory, a random access memory, a magnetic or optical memory device (e.g., disk), a magnetic tape, a solid state drive and the like. It is further noted that memory medium 134 may be housed in a common controller housing with the one or more processors 132. In one embodiment, the memory medium 134 may be located remotely with respect to the physical location of the one or more processors 132 and controller 130. For instance, the one or more processors 132 of controller 130 may access a remote memory (e.g., server), accessible through a network (e.g., internet, intranet and the like). Therefore, the above description should not be interpreted as a limitation on the present invention but merely an illustration.

In another embodiment, the controller 130 is communicatively coupled to one or more elements of the metrology system 100. In this regard, the controller 130 may transmit and/or receive data from any component of the metrology system 100. Further, the controller 130 may direct or otherwise control any component of the metrology system 100 by generating one or more drive signals for the associated components. For example, the controller 130 may be communicatively coupled to the detector 104 to receive one or more images from the detector 104.

Further, the controller 130 may provide one or more drive signals to the detector 104 to carry out any of the detection techniques described herein. By way of another example, the controller 130 may be communicatively coupled to any combination of components to control the optical configuration associated with an image including, but not limited to, the illumination source 106, the illumination optical components 114, the collection optical components 126, the detector 104, or the like. In some embodiments, the metrology system 100 may include an illumination sub-system configured to direct one or more illumination lobes 108 from the illumination source 106 to the hatched overlay target on the sample 102. In some embodiments, the metrology system 100 may include an imaging sub-system including, for example, an objective lens, a pupil mask at a collection pupil plane, and the detector 104 at a field plane configured to image the hatched overlay target based on diffraction orders passed by the pupil mask. In some embodiments, the controller may configure the pupil mask for different overlay measurements. For example, in a first configuration for X-direction measurement, the pupil mask may block diffraction orders associated with Y-direction measurement at the pupil plane. Alternatively, in a second configuration for Y-direction measurement, the pupil mask may block diffraction orders associated with X-direction measurement at the pupil plane.

Figure 2A:
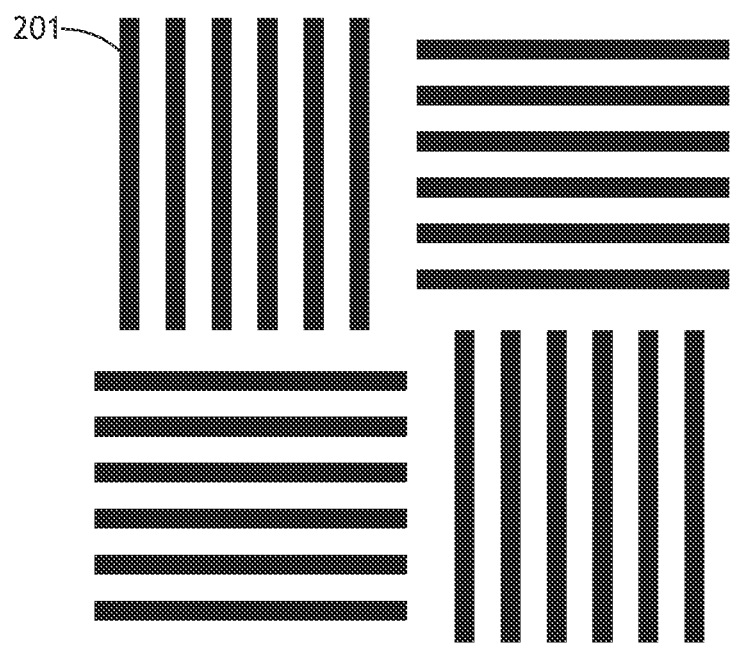
FIGS. 2A-2C are top plan views illustrating hatched layers of a metrology target, in accordance with one or more embodiments of the present disclosure.
Figure 2B:
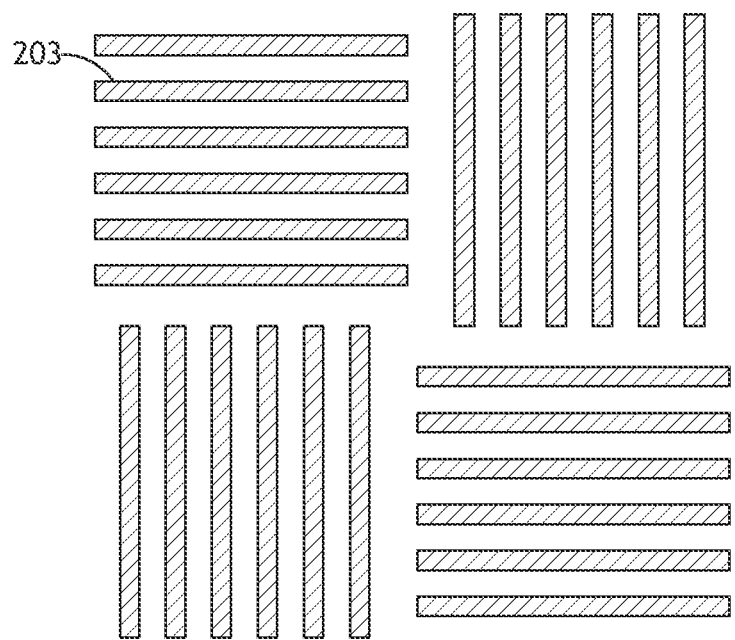
Figure 2C:
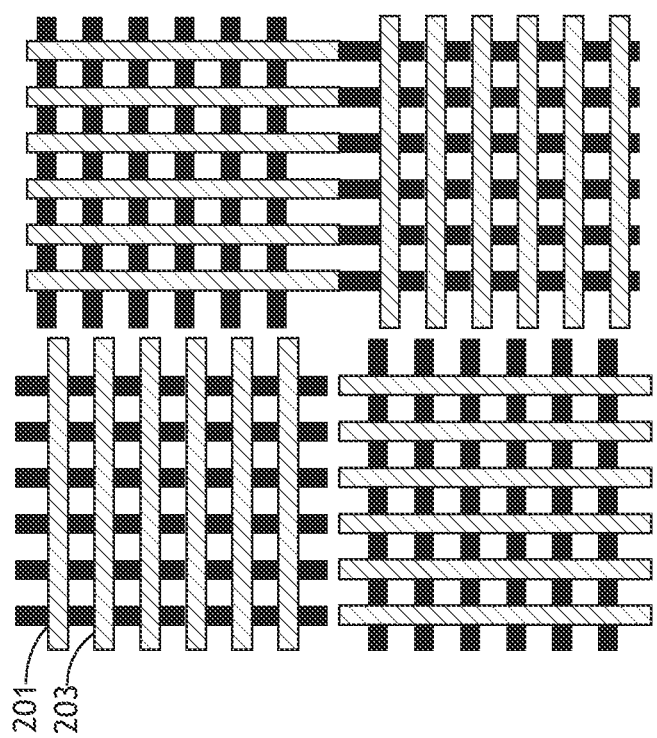

FIGS. 2A-C are top plan views showing the layers of a hatched overlay target (e.g., on the sample 102). FIG. 2A shows a first layer 201 comprising two grating structures having a first periodicity along the X-direction (e.g., X-direction grating structures) and two grating structures having a second periodicity along the Y-direction (e.g., Y-direction grating structures). FIG. 2B shows a second layer 203 comprising two grating structures having a first periodicity along the X-direction (e.g., X-direction grating structures) and two grating structures having a second periodicity along the Y-direction (e.g., Y-direction grating structures). It is noted herein that the terms "X-direction" and "Y-direction" are used for illustrative purposes, and should not be construed as limiting the present disclosure. In general, a first direction (e.g., an X-direction or a horizontal direction) may be non-parallel (or substantially non-parallel) to a second direction (e.g., a Y-direction or a vertical direction). Additionally, in some embodiments, the first direction may be orthogonal (or substantially orthogonal) to the second direction.

FIG. 2C shows the hatched overlay target formed by the second layer 203 overlapping the first layer 201. In other embodiments, the first layer may 201 may overlap the second layer 203. The hatched overlay target may include two sets of cells. For the first set of cells, the grating structures along the Y-direction of the second layer 203 may overlap the grating structures along the X-direction of the first layer 201. For the second set of cells, the grating structures along the X-direction of the second layer 203 may overlap the grating structures along the Y-direction of the first layer 201.

For either of the layers 201 and 203, the periodicities of the grating structures oriented along the X-direction may be different in value from the periodicities of the grating structures oriented along the Y-direction. Additionally, the periodicities of the grating structures in the first layer 201 may be different in value from the periodicities of the grating structures in the second layer 203. However, in some embodiments, it may be advantageous to configure the periodicities of the grating structures in the first layer 201 to be equal or close to the periodicities of the grating structures in the second layer 203.

FIGS. 3-12 illustrate various optical configurations for sample illumination (e.g., at the illumination or entrance pupil) and collection (e.g., at one or more collection or exit pupils) using hatched overlay targets having two or more layers.

By configuring a metrology recipe defining various the periodicities of the grating structures, the numerical apertures of the illumination and collection paths, the placement of illumination, the wavelengths of the sample light, and, optionally, a pupil mask at the collection pupil plane, the appropriate diffraction orders for each measurement direction may pass the collection pupil (and undesirable diffraction orders may be blocked at the collection pupil) to generate an image at the detector 104. The image may then be used to calculate an overlay measurement using a misregistration algorithm. In some embodiments, one measurement direction may be measured (e.g., the X-direction). For example, one or more images of the hatched overlay target may be generated in which only grating features along the measurement direction are resolved. In some embodiments, two measurement directions may be measured (e.g., the X- and Y-directions). For example, one or more images of the hatched overlay target may be generated in which the various cells of the hatched overlay target appear as Moiré grating structures oriented diagonally along one or more Moiré grating directions different than the directions of periodicity of the gratings in the target.

The optical configurations described with respect to FIGS. 3-12 may advantageously improve several aspects of conventional overlay metrology. For one, the periodicities of grating structures may be significantly reduced which may enable smaller metrology targets. Smaller metrology targets may reduce manufacturing costs since less space may be required solely for metrology purposes on a semiconductor wafer, reticle, etc. Additionally, improving the contrast between layers of targets may increase the accuracy of overlay measurements. Furthermore, overlay measurement may be performed using fewer steps.

In some embodiments, the optical configurations described with respect to FIGS. 3-12 may include a Littrow illumination configuration. Littrow illumination is described in U.S. Pat. No. 10,197,389 and in U.S. Pat. Appl. Publ. No. 2020/0132446 (see, e.g., FIG. 1) which are both incorporated herein by reference in their entirety. In the Littrow illumination configuration, the diffraction orders to be collected are diffracted at 180° with respect to the illumination lobe (e.g., in the opposite direction to which the illumination lobe impinges the surface of a sample). The advantages of the Littrow illumination configuration may include focus independence and increased accuracy. It is noted that the present disclosure is not limited thereto, and other illumination configurations are also possible. If the Littrow illumination configuration is used, then the overlay measurement and the contrast may both be insensitive to the focal position. If the Littrow illumination configuration is not used, then only the contrast may be insensitive to the focal position. Littrow illumination may require adjustments to both the periodicities of grating structures and the numerical aperture (NA) of the optical paths to produce accurate measurements. In some embodiments, the optical configurations described with respect to FIGS. 3-12 may include dark field two-beam imaging configurations. Simple dark field configurations are described in U.S. Pat. No. 7,440,105 which is incorporated herein by reference in its entirety.

For each measurement step, it may be desirable to produce an image that (a) shows gratings oriented along the same direction (e.g., either the X-direction or the Y-direction) for all of the quadrants of the metrology target and (b) stops the gratings having the other orientation from interfering with the measurements (e.g., if X-direction gratings are to be measured, then Y-direction gratings are to be blocked from the image). For example, to produce such an image for X-direction overlay measurement, the system 100 may be configured to pass selected diffraction orders (associated with the X-direction measurement) through the collection pupil, and leave diffraction orders (associated with the Y-direction measurement) out of the collection pupil. In some embodiments, an adjustable pupil mask (i.e., one or more aperture stops and/or blockers) may be placed at the collection pupil to block diffraction orders generated by the X-direction gratings at the collection pupil (when the Y-direction is being measured) or to block diffraction orders generated by the Y-direction gratings at the collection pupil (when the X-direction is being measured).

FIGS. 3 and 4 show one-step centric configurations of the metrology system 100 for illumination (e.g., at the illumination or entrance pupil) of the sample 102 and collection (e.g., at one or more collection or exit pupils) of light reflected or scattered from the sample. In some embodiments, a single illumination lobe may impinge the overlay target at an angle of normal incidence. An objective lens may be configured to collect light from the hatched overlay target. An adjustable pupil mask at a collection pupil may be configured to pass appropriate diffraction orders (e.g., diffraction orders required for measurement in one direction), and to block undesirable diffraction orders (e.g., the diffraction orders not necessary for the measurement). It is noted that although FIGS. 3 and 4 describe overlay measurement along the X-direction (i.e., a first direction), similar techniques may be employed for overlay measurement along the Y-direction (i.e., a second direction), and that the present disclosure is not limited to the measurement of overlay in a particular direction.

FIG. 3 shows a one-step centric configuration of the metrology system 100 for illumination (e.g., at the illumination or entrance pupil) of the sample 102 and collection (e.g., at one or more collection or exit pupils). The sample 102 may include a hatched overlay target substantially similar to the metrology target shown in FIG. 2C. In this embodiment, overlay may be measured along the X-direction. An illumination lobe 301 may illuminate the hatched overlay target of the sample 102 (e.g., sample layers 201 and 202). The first-direction gratings may diffract the illumination lobe 301 and generate first-order diffraction along the first direction and 0-order diffraction. The second-direction gratings may diffract the illumination lobe 301 and generate first-order diffraction along the second direction and 0-order diffraction. In some embodiments, an adjustable pupil mask 315 may block the diffraction orders generated by the gratings oriented along the non-measurement direction at the collection pupil plane. For example, in a first configuration for X-direction measurement, the pupil mask 315 may block the non-zero diffraction (e.g., first-order diffraction, second-order diffraction, and higher) generated by the Y-direction gratings. In a second configuration for Y-direction measurement, the pupil mask 315 may block the non-zero diffraction generated by the X-direction gratings.

The detector 104 at a field plane (e.g., conjugate to the sample 102) may generate an image based on the diffraction orders passed through the collection pupil. Features of the sample 102 may appear in the generated image. The X-direction gratings may be at least partially resolved in the image and the Y-direction gratings may be unresolved in the image. An overlay measurement may be computed from the image using any conventional overlay measurement algorithm (e.g., an AIM® misregistration algorithm). An advantage of the embodiment shown in FIG. 3 may be the reduction of cross-talk by isolating the X-direction measurement from the Y-direction measurement.

FIG. 4 shows a one-step centric configuration of the metrology system 100 for illumination (e.g., at the illumination or entrance pupil) of the sample 102 and collection (e.g., at one or more collection or exit pupils). The sample 102 may include a hatched overlay target substantially similar to the metrology target shown in FIG. 2C. In this embodiment, overlay may be measured along the X-direction. An illumination lobe 301 may illuminate the hatched overlay target of the sample 102 (e.g., sample layers 201 and 202) at a normal incidence angle as also illustrated in FIG. 3. In this embodiment, the pupil mask 315 may be further configured to block 0-order diffraction (e.g., to enable dark-field measurement) for X and Y direction measurements.

The detector 104 at a field plane (e.g., conjugate to the sample 102) may generate an image based on the diffraction orders passed through the collection pupil. Features of the sample 102 may appear in the generated image. The X-direction gratings may be at least partially resolved in the image and the Y-direction gratings may be unresolved in the image. Since 0-order diffraction is blocked by the mask 315, the apparent X-direction gratings resolved in the image may appear to have a period that is half (½) the actual period (e.g., the real or physical period) of the X-direction gratings on the sample 102. An overlay measurement may be computed from the image using any conventional overlay measurement algorithm (e.g., an AIM® misregistration algorithm). An advantage of the embodiment shown in FIG. 4 may be to reduce the cross-talk effect by isolating the X-direction measurement from the Y-direction measurement. Additionally, the dark field measurement may minimize the sensitivity of the overlay to focus and remove DC from the image.

FIGS. 5-7B show off-center configurations of the metrology system 100 for illumination (e.g., at the illumination or entrance pupil) of the sample 102 and collection (e.g., at one or more collection or exit pupils). In some embodiments, two illumination lobes may impinge the overlay target at symmetrically-opposed oblique angles with respect to the target (either sequentially or simultaneously). An objective lens may be configured to collect light from the hatched overlay target and the metrology system 100 may be arranged to collect appropriate diffraction orders (e.g., diffraction orders required for the measurement direction). It is noted that FIGS. 5-7B show the measurement of overlay along the X-direction (i.e., a first direction) and along the Y-direction (i.e., a second direction) and that the present disclosure is not limited to the measurement of overlay in a particular direction.

Figure 5:
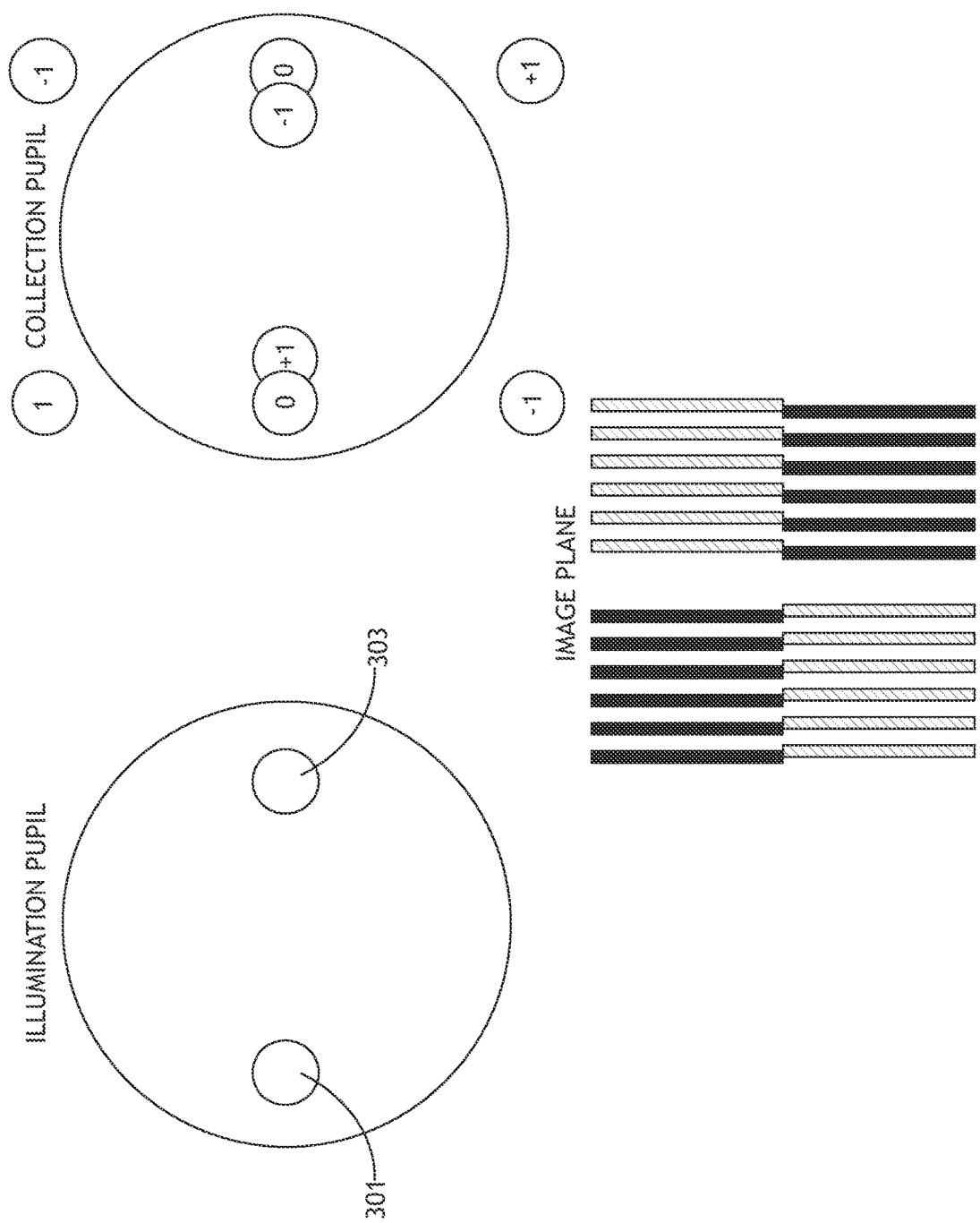
FIG. 5 illustrates a one-step off-center configuration for sample illumination and collection, in accordance with one or more embodiments of the present disclosure.

FIG. 5 shows a one-step off-center configuration of the metrology system 100 for illumination (e.g., at the illumination or entrance pupil) of the sample 102 and collection (e.g., at one or more collection or exit pupils). The sample 102 may include a hatched overlay target substantially similar to the metrology target shown in FIG. 2C. In this embodiment, overlay may be measured along the X-direction. Illumination lobes 301 and 303 may illuminate the hatched overlay target of the sample 102 (e.g., sample layers 201 and 202) symmetrically opposed to each other along the first direction. The first-direction gratings may diffract the illumination lobes 301 and 303 and generate a first-order diffraction beam along the first direction and 0-order diffraction. The second-direction gratings may diffract the illumination lobes 301 and 303 and generate a first-order diffraction beam along the second direction and 0-order diffraction. In some embodiments, the system 100 may be arranged such that selected diffraction orders (e.g., first-order diffraction generated by X-direction gratings and zero-order diffraction generated by both X-direction and Y-direction gratings) pass through the collection pupil and other diffraction orders (e.g., non-zero diffraction generated by Y-direction gratings) are not collected by the metrology system 100 or are otherwise outside the boundaries of the collection pupil. In this way, the diffraction orders generated by the gratings oriented along the X-direction may form the basis of an image of the hatched overlay target.

The detector 104 at a field plane (e.g., conjugate to the sample 102) may generate an image based on the diffraction orders passed through the collection pupil. Features of the sample 102 may appear in the generated image. The X-direction gratings may be at least partially resolved in the image and the Y-direction gratings may be unresolved in the image. Overlay may be computed from the image using any conventional overlay measurement algorithm (e.g., an AIM® misregistration algorithm). An advantage of the embodiment shown in FIG. 5 may be the reduction of cross-talk by isolating the X-direction measurement from the Y-direction measurement. Additionally, this embodiment enables a grating structure periodicity (e.g., around 400-800 nm) which may significantly reduce the size of the metrology target. For example, when each of the cells in the collected image has seven visible pitches, the entire metrology target (about fourteen pitches) may be about 6 microns. Thus, the area of the metrology target may be reduced to below 6 microns by 6 microns while otherwise preserving all the capabilities of a larger metrology target.

FIGS. 6A and 6B show a two-step off-center configuration of the metrology system 100 for illumination (e.g., at the illumination or entrance pupil) of the sample 102 and collection (e.g., at one or more collection or exit pupils). The sample 102 may include a hatched overlay target substantially similar to the metrology target shown in FIG. 2C. In this embodiment, overlay may be measured along the X-direction and the diffraction orders generated by the Y-direction gratings may be left out of the collection pupil. Thus, the diffraction orders generated by the gratings oriented along the X-direction are isolated. In some embodiments, a source mask may block the illumination source 106 to illuminate the overlay target with the two illumination lobes 301 and 303 sequentially. The source mask may block the first illumination lobe 301 at the illumination source 106 at a first time, and subsequently, may block the second illumination lobe 303 at the illumination source 106 a second time. Alternatively, the illumination source may sequentially produce the first illumination lobe 301 and the second illumination lobe 303. It is noted herein that the illumination lobes 301 and 303 are not required to be equalized (e.g., in intensity, etc.).

In a first step shown in FIG. 6A, an illumination lobe 301 may illuminate the hatched overlay target of the sample 102 (e.g., sample layers 201 and 202) along the first direction. The first-direction gratings may diffract the illumination lobe 301 and generate a first-order diffraction beam along the first direction and 0-order diffraction. The first-order diffraction beam and the 0-order diffraction may be passed through the collection pupil and non-zero diffraction generated by the second-direction gratings may not be collected by the metrology system 100 or otherwise outside of the collection pupil. The detector 104 at a field plane (e.g., conjugate to the sample 102) may generate a first image based on the diffraction orders passed through the collection pupil. Features of the sample 102 may appear in the first image. The X-direction gratings may be at least partially resolved in the first image and the Y-direction gratings may be unresolved in the first image.

In a second step shown in FIG. 6B, an illumination lobe 303 may illuminate the hatched overlay target of the sample 102 (e.g., sample layers 201 and 202) along the first direction symmetrically opposed to the first illumination lobe 301. The first-direction gratings may diffract the illumination lobe 303 and generate a first-order diffraction beam along the first direction and 0-order diffraction. The first-order diffraction beam along the first direction and the 0-order diffraction may be passed through the collection pupil and non-zero diffraction generated by the second-direction gratings may not be collected by the metrology system 100 or otherwise outside of the collection pupil. The detector 104 at a field plane (e.g., conjugate to the sample 102) may generate a second image based on the diffraction orders passed through the collection pupil. Features of the sample 102 may appear in the second image. The X-direction gratings may be at least partially resolved in the second image and the Y-direction gratings may be unresolved in the second image.

An overlay measurement may be computed from the two images using any conventional overlay measurement algorithm (e.g., an AIM® misregistration algorithm). In some embodiments, a first overlay error computed from the first image may be averaged with a second overlay error computed from the second image. An advantage of the embodiment shown in FIGS. 6A-6B may be the reduction of cross-talk by isolating the X-direction measurement from the Y-direction measurement. Additionally, this embodiment enables a smaller grating structure periodicity (around 400-800 nm) which may significantly reduce the size of the metrology target. For example, when each of the cells in the image has seven visible pitches, the whole metrology target (about fourteen pitches) may be about 6 microns. Thus, the area of the metrology target may be reduced to below 6 microns by 6 microns while otherwise preserving all the capabilities of a larger conventional metrology target. Additionally, since this embodiment employs two beams for imaging, the contrast of the image is less sensitive to changes in focus.

FIGS. 7A and 7B show a two-step off-center configuration of the metrology system 100 for illumination of the sample 102 and collection. The sample 102 may include a hatched overlay target substantially similar to the metrology target shown in FIG. 2C. In this embodiment, overlay error may be measured along the Y-direction. This embodiment may be substantially similar to the embodiment described with respect to FIGS. 6A and 6B, except that the sample is rotated 90° in order to measure the Y-direction overlay. Alternatively, the illumination lobes may be rotated 90° in order to measure the Y-direction overlay (e.g., by rotating the illumination source 106).

In a first step shown in FIG. 7A, an illumination lobe 301 may illuminate the hatched overlay target of the sample 102 (e.g., sample layers 201 and 202). The second-direction gratings may diffract the illumination lobe 301 and generate a first-order diffraction beam along the second direction and 0-order diffraction. The first-order diffraction beam along the second direction and the 0-order diffraction may be passed through the collection pupil and non-zero diffraction generated by the first-direction gratings may not be collected by the metrology system 100 or otherwise outside of the collection pupil. The detector 104 at a field plane (e.g., conjugate to the sample 102) may generate a first image based on the diffraction orders passed through the collection pupil. Features of the sample 102 may appear in the first image. The Y-direction gratings may be at least partially resolved in the first image and the X-direction gratings may be unresolved in the first image.

In a second step shown in FIG. 7B, an illumination lobe 303 may illuminate the hatched overlay target of the sample 102 (e.g., sample layers 201 and 202). It is noted herein that the illumination lobes 301 and 303 are not required to be equalized (e.g., in intensity, etc). The second-direction gratings may diffract the illumination lobe 303 and generate a first-order diffraction beam along the second direction and 0-order diffraction. The first-order diffraction beam along the second direction and the 0-order diffraction may be passed through the collection pupil and non-zero diffraction generated by the first-direction gratings may not be collected by the metrology system 100 or otherwise outside of the collection pupil. The detector 104 at a field plane (e.g., conjugate to the sample 102) may generate a second image based on the diffraction orders passed through the collection pupil. Features of the sample 102 may appear in the second image. The Y-direction gratings may be at least partially resolved in the second image and the X-direction gratings may be unresolved in the second image.

Overlay error may be computed from the image using any conventional overlay measurement algorithm (e.g., an AIM® misregistration algorithm). In some embodiments, a first overlay error computed from the first image may be averaged with a second overlay error computed from the second image. An advantage of the embodiment shown in FIGS. 7A-7B may be the reduction of cross-talk by isolating the X-direction measurement from the Y-direction measurement. Additionally, this embodiment enables a smaller grating structure periodicity (around 400-800 nm) which may significantly reduce the size of the metrology target. For example, when each of the cells has seven pitches visible in the image, the whole metrology target (about fourteen pitches) may be about 6 microns. Thus, the area of the metrology target may be reduced to below 6 microns by 6 microns while otherwise preserving all the capabilities of a larger conventional metrology target.

FIGS. 8A-8D show a four-step off-center tilted configuration of the metrology system 100 for illumination of the sample 102 and collection. The sample 102 may include a hatched overlay target substantially similar to the metrology target shown in FIG. 2C. In this embodiment, overlay may be measured in both the X-direction and the Y-direction and an illumination sub-system may sequentially illuminate the hatched overlay target with four illumination lobes. The target may have a common periodicity (i.e., the same or equal periodicities) for X-direction gratings in the first layer and the second layer (i.e., in the first set of cells and the second set of cells) and a common periodicity for Y-direction gratings in the first layer and the second layer (i.e., in the first set of cells and the second set of cells). In some embodiments, the periodicities of the gratings may be of from about 600 to about 1200 nm (e.g., to improve the signal to noise ratio since the intensity of zero harmonics may be significantly smaller).

At each step of FIGS. 8A-8D, Moiré gratings (e.g., Moiré patterns) may respectively appear in the images generated at the image plane by the detector 104. Each of the Moiré patterns may have a Moiré period along a Moiré grating direction caused by selected diffraction orders (e.g., Moiré diffraction orders) generated by the layers 201 and 202 of the metrology target. If the X-direction gratings and the Y-direction gratings have the same periodicity, the Moiré pattern may appear in the collected image tilted at a 45° angle (i.e., oriented diagonally in the image) and the repeatability (e.g., precision) of the overlay measurements may be improved. If the X-oriented gratings and the Y-oriented gratings have different periodicities, the Moiré pattern may appear in the collected image at an angle that is not 45° (non-diagonal). The Moiré patterns shown in FIGS. 8A-8D illustrate a configuration in which the periodicity of the X-direction gratings is lower than the periodicity of the Y-direction oriented gratings.

At each step of FIGS. 8A-8D, an overlay measurement along a Moiré grating direction may be determined based on the Moiré pattern using a diagonal overlay measurement algorithm (e.g., DAIM®; registered trademark of KLA Corporation, Milpitas, Calif.). It is noted that the computed overlay measurement is neither an X-direction nor a Y-direction overlay measurement but rather a mix of both directions, and that measurement of the actual overlay error (e.g. on the sample 102) may be extracted from the computed overlay measurement (e.g., using linear algebra). Overlay measurements employing diagonal Moiré patterns may be advantageous since the lines of a Moiré pattern are not parallel to any measurement direction and edge effects are thus minimized. The reduction of edge effects may further reduce the size of the metrology target.

In a first step shown in FIG. 8A, an illumination lobe 301 may illuminate the hatched overlay target of the sample 102 (e.g., sample layers 201 and 202) along a first diagonal direction different from the X-direction and the Y-direction. The first-direction gratings may diffract the illumination lobe 301 and generate a first-order diffraction beam along the first direction. The second-direction gratings may diffract the illumination lobe 301 and generate a first-order diffraction beam along the second direction. The first-order diffraction beams along the first and second directions may be selectively passed through the collection pupil by an adjustable pupil mask 315. The detector 104 at a field plane (e.g., conjugate to the sample 102) may generate a first image based on the diffraction orders passed through the collection pupil. A first Moiré pattern along a first Moiré grating direction may appear in a first image in locations of the first and second sets of cells (see, e.g., the image plane). An overlay measurement (denoted O1) along the first Moiré grating direction (different from the X-direction and the Y-direction) may be computed using a diagonal overlay measurement algorithm (e.g., DAIM®) based on the first Moiré pattern.

In a second step shown in FIG. 8B, an illumination lobe 303 may illuminate the hatched overlay target of the sample 102 (e.g., sample layers 201 and 202) opposite from the first illumination lobe along the first diagonal direction. The first-direction gratings may diffract the illumination lobe 303 and generate a first-order diffraction beam along the first direction. The second-direction gratings may diffract the illumination lobe 303 and generate a first-order diffraction beam along the second direction. The first-order diffraction beams along the first and second directions may be selectively passed through the collection pupil by an adjustable pupil mask 315. The detector 104 at a field plane (e.g., conjugate to the sample 102) may generate a second image based on the diffraction orders passed through the collection pupil. A second Moiré pattern along the first Moiré grating direction may appear in a second image in locations of the first and second sets of cells (see, e.g., the image plane). An overlay measurement (denoted O2) along the first Moiré grating direction may be computed using a diagonal overlay measurement algorithm (e.g., DAIM®) based on the second Moiré pattern.

In a third step shown in FIG. 8C, an illumination lobe 305 may illuminate the hatched overlay target of the sample 102 (e.g., sample layers 201 and 202) along a second diagonal direction different from the first diagonal direction. The first-direction gratings may diffract the illumination lobe 305 and generate a first-order diffraction beam along the first direction. The second-direction gratings may diffract the illumination lobe 305 and generate a first-order diffraction beam along the second direction. The first-order diffraction beams along the first and second directions may be selectively passed through the collection pupil by an adjustable pupil mask 315. The detector 104 at a field plane (e.g., conjugate to the sample 102) may generate a third image based on the diffraction orders passed through the collection pupil. A third Moiré pattern along a second Moiré grating direction may appear in the third image in locations of the first and second sets of cells (see, e.g., the image plane). An overlay measurement (denoted O3) along a second Moiré grating direction may be computed using a diagonal overlay measurement algorithm (e.g., DAIM®) based on the third Moiré pattern.

In a fourth step shown in FIG. 8D, an illumination lobe 307 may illuminate the hatched overlay target of the sample 102 (e.g., sample layers 201 and 202) opposite from the illumination lobe 305 and along the second diagonal direction. The first-direction gratings may diffract the illumination lobe 307 and generate a first-order diffraction beam along the first direction. The second-direction gratings may diffract the illumination lobe 307 and generate a first-order diffraction beam along the second direction. The first-order diffraction beams along the first and second directions may be selectively passed through the collection pupil by an adjustable pupil mask 315. The detector 104 at a field plane (e.g., conjugate to the sample 102) may generate a fourth image based on the diffraction orders passed through the collection pupil. A fourth Moiré pattern along the second Moiré grating direction may appear in the fourth image in locations of the first and second sets of cells (see, e.g., the image plane). An overlay measurement (denoted O4) along the second Moiré grating direction may be computed using a diagonal overlay measurement algorithm (e.g., DAIM®) based on the fourth Moiré pattern.

It is noted that the first Moiré grating direction (shown in FIGS. 8A-8B) and the second Moiré grating direction (shown in FIGS. 8C-8D) may be different (e.g., rotated by 90° and facing different diagonals in the image plane). The periodicities of the X-direction grating structures and the periodicities of the Y-direction grating structures may define the first Moiré grating direction and the second Moiré grating direction. In the embodiments of FIGS. 8A-8D, since the X-direction and Y-direction periodicities are the same, the first Moiré grating direction and second Moiré grating direction are oriented at 45° (e.g., substantially diagonally).

Figure 9:
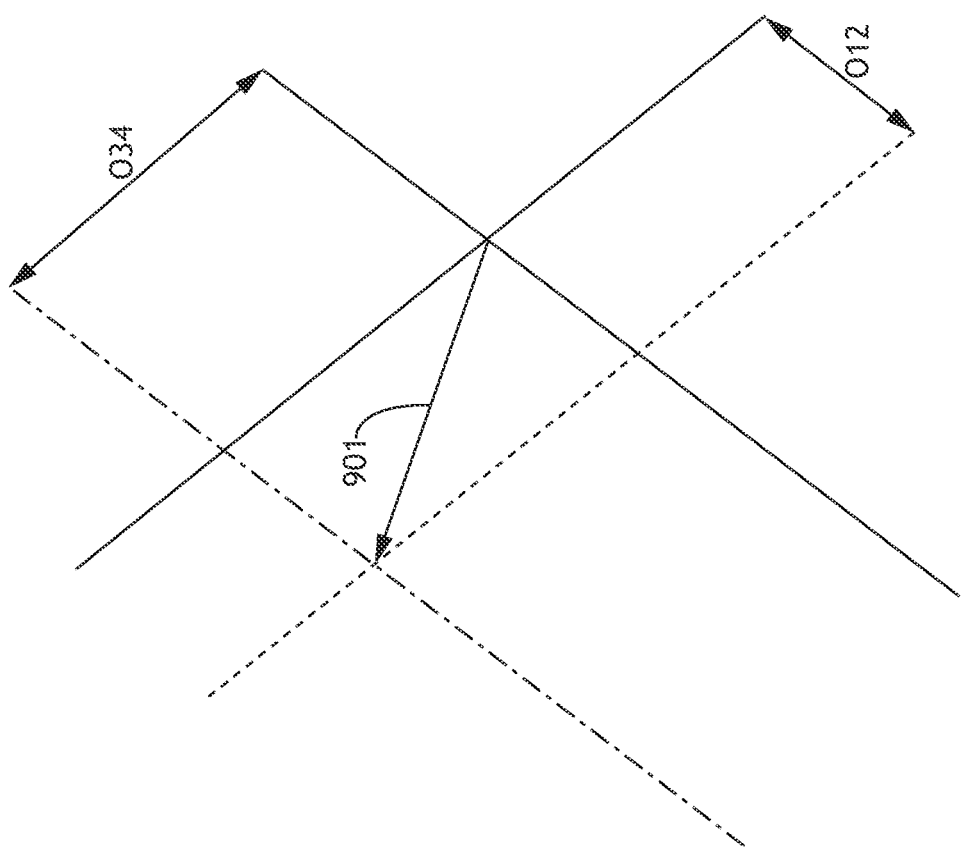
FIG. 9 illustrates an overlay measurement vector computation, in accordance with one or more embodiments of the present disclosure.

As shown in FIG. 9, overlay measurements along the X and Y directions on the sample may be computed based on the overlay measurements O1, O2, O3, and O4 along the Moiré grating directions. An overlay measurement O12 along the first Moiré grating direction may be computed as an average of O1 and O2. An overlay measurement O34 along the second Moiré grating direction may be computed as an average of O3 and O4. A vector 901 (e.g., a linear combination of O12 and O34) may determine an overlay error on the sample 102 along the combined direction of the vector 901. Overlay measurements along both the X-direction and the Y-direction on the sample 102 may be extracted from the vector 901. An overlay measurement along the X-direction on the sample 102 may be extracted from the X coordinates (e.g., a first component from an X-direction projection) of the vector 901 and an overlay measurement along the Y-direction on the sample 102 may be extracted from the Y coordinates (e.g., a second component from a Y-direction projection) of the vector 901.

FIGS. 10A and 10B show alternative configurations of FIGS. 8C and 8D. In FIGS. 10A-10B, the illumination lobes 301 and 303 oriented along the first diagonal direction may be used for all imaging steps. Since the illumination configuration is unchanged from FIGS. 8A-8B, the third illumination lobe 305 and fourth illumination lobe 307 oriented along the second diagonal direction are not required to generate the third and fourth Moiré patterns. In this way, a simpler and faster overlay measurement may be enabled. It is noted that the imaging steps depicted in FIGS. 8A-8D and 10A-10B may be performed in any sequence. For example, the imaging step depicted in FIG. 10A may be performed before or after the step depicted in FIG. 8A.

In FIG. 10A, the illumination lobe 301 may illuminate the hatched overlay target sample 102 (e.g., sample layers 201 and 202) along the first diagonal direction. The hatched overlay target may diffract the illumination lobe 301 and generate a Moiré diffraction order and 0-order diffraction. The Moiré diffraction order and 0-order diffraction may be selectively passed through the collection pupil by an adjustable pupil mask 315. The detector 104 at a field plane (e.g., conjugate to the sample 102) may generate a third image based on the diffraction orders passed through the collection pupil. A third Moiré pattern along a second Moiré grating direction may appear in the third image in locations of the first and second sets of cells (see, e.g., the image plane). An overlay measurement (denoted O3) along the second Moiré grating direction may be computed using a diagonal overlay measurement algorithm (e.g., DAIM®) based on the third Moiré pattern.

In FIG. 10B, an illumination lobe 303 may illuminate the hatched overlay target of the sample 102 (e.g., sample layers 201 and 202) opposite from the first illumination lobe 301 along the first diagonal direction. The hatched overlay target may diffract the illumination lobe 303 and generate a Moiré diffraction order and 0-order diffraction. The Moiré diffraction order and 0-order diffraction may be selectively passed through the collection pupil by an adjustable pupil mask 315. The detector 104 at a field plane (e.g., conjugate to the sample 102) may generate a fourth image based on the diffraction orders passed through the collection pupil. A fourth Moiré pattern along the second Moiré grating direction may appear in the fourth image in locations of the first and second sets of cells (see, e.g., the image plane). An overlay measurement (denoted O4) along the second Moiré grating direction may be computed using a diagonal overlay measurement algorithm (e.g., DAIM®) based on the fourth Moiré pattern.

Figure 11B:
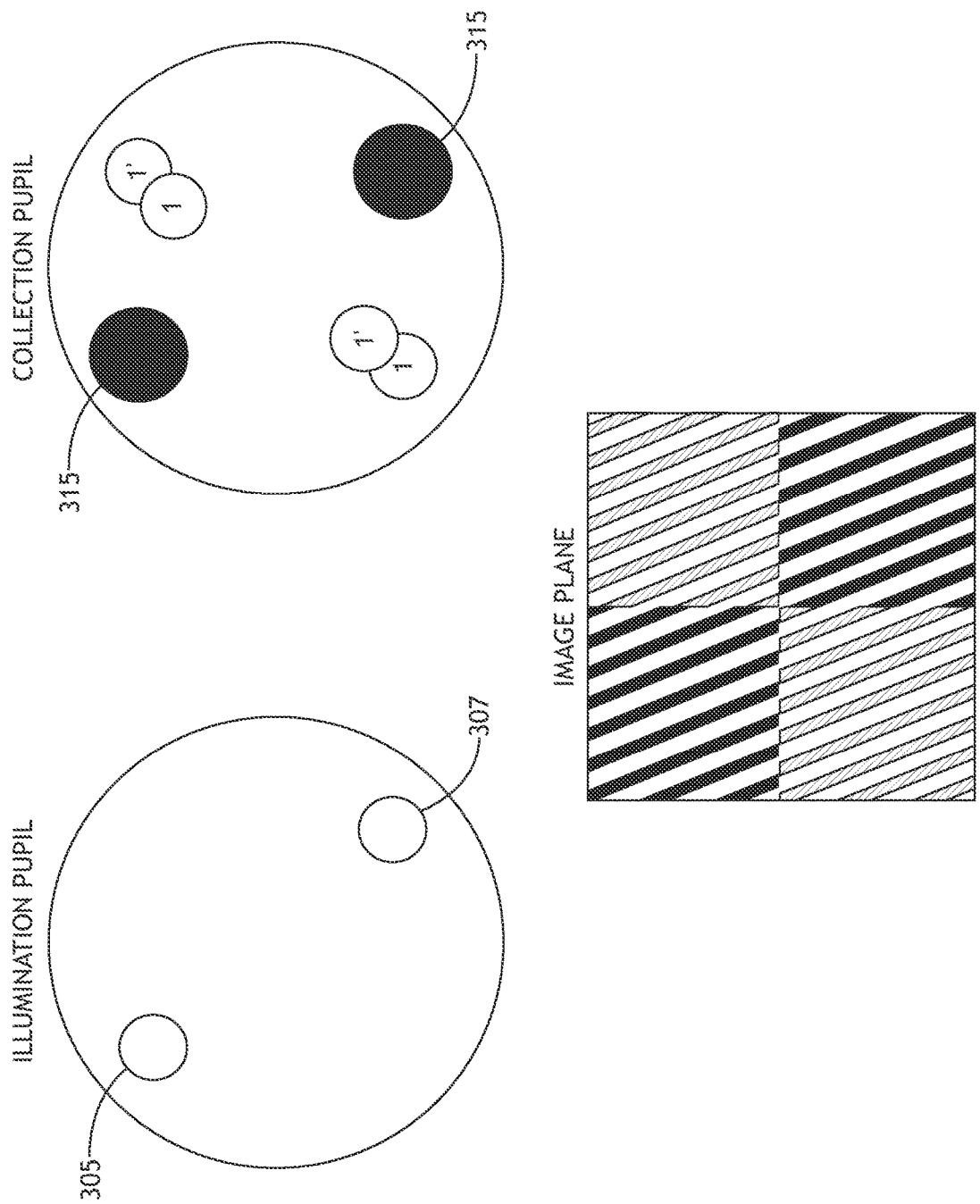

FIGS. 11A-11B show a two-step off-center tilted configuration of the metrology system 100 for illumination of the sample 102 and collection. FIG. 11A shows an alternative configuration combining the steps of FIGS. 8A and 8B into a single step. Likewise, FIG. 11B shows an alternative configuration combining the steps of FIGS. 8C and 8D into a single step. In this embodiment, the hatched overlay target may be sequentially illuminated with a first pair of illumination lobes 301 and 303 and a second pair of illumination lobes 305 and 307.

In FIG. 11A, a first pair of illumination lobes 301 and 303 may illuminate the sample (e.g., sample layers 201 and 202) along the first diagonal direction. The first-direction gratings may diffract the illumination lobe 301 and generate a first-order diffraction beam along the first direction. The second-direction gratings may diffract the illumination lobe 301 and generate a first-order diffraction beam along the second direction. The first-direction gratings may diffract the illumination lobe 303 and generate a first-order diffraction beam along the first direction. The second-direction gratings may diffract the illumination lobe 303 and generate a first-order diffraction beam along the second direction. The first-order diffraction beams along the first and second directions may be selectively passed through the collection pupil by an adjustable pupil mask 315. The detector 104 at a field plane (e.g., conjugate to the sample 102) may generate a first image based on the diffraction orders passed through the collection pupil. A first Moiré pattern along a first Moiré grating direction may appear in the first image in locations of the first and second sets cells (see, e.g., the image plane). An overlay measurement (denoted O12) along the first Moiré grating direction (different from the X-direction and the Y-direction) may be computed using a diagonal overlay measurement algorithm (e.g., DAIM®) based on the first Moiré pattern.

In FIG. 11B, a second pair of illumination lobes 305 and 307 may illuminate the sample (e.g., sample layers 201 and 202) along the second diagonal direction. The first-direction gratings may diffract the illumination lobe 305 and generate a first-order diffraction beam along the first direction. The second-direction gratings may diffract the illumination lobe 305 and generate a first-order diffraction beam along the second direction. The first-direction gratings may diffract the illumination lobe 307 and generate a first-order diffraction beam along the first direction. The second-direction gratings may diffract the illumination lobe 307 and generate a first-order diffraction beam along the second direction. The first-order diffraction beams along the first and second directions may be selectively passed through the collection pupil by an adjustable pupil mask 315. The detector 104 at a field plane (e.g., conjugate to the sample 102) may generate a second image based on the diffraction orders passed through the collection pupil. A second Moiré pattern along a second Moiré grating direction may appear in a second image in locations of the first and second sets cells (see, e.g., the image plane). An overlay measurement (denoted O34) along the second Moiré grating direction may be computed using a diagonal overlay measurement algorithm (e.g., DAIM®) based on the second Moiré pattern.

FIG. 12 shows an alternative configuration of FIG. 11B. In FIG. 12, the illumination lobes 301 and 303 along the first diagonal direction may be used for all imaging steps. Since the illumination configuration is unchanged from FIGS. 8A-8B, the third illumination lobe 305 and fourth illumination lobe 307 oriented along the second diagonal direction are not required to generate the second Moiré patterns. In this way, since the illumination configuration is unchanged and only the pupil mask 315 is adjusted, the embodiment of FIG. 12 may enable a simpler and faster overlay measurement.

In FIG. 12, the first pair of illumination lobes 301 and 303 may illuminate the hatched overlay target of the sample 102 (e.g., sample layers 201 and 202) along the first diagonal direction. The hatched overlay target may diffract the illumination lobe 301 and generate a Moiré diffraction order and 0-order diffraction. The hatched overlay target may diffract the illumination lobe 303 and generate a Moiré diffraction order and 0-order diffraction. The Moiré diffraction orders and 0-order diffraction may be selectively passed through the collection pupil by an adjustable pupil mask 315. The detector 104 at a field plane (e.g., conjugate to the sample 102) may generate a second image based on the diffraction orders passed through the collection pupil. A second Moiré pattern along a second Moiré grating direction may appear in the second image in locations of the first and second sets of cells (see, e.g., the image plane). An overlay measurement (denoted O34) along a second Moiré grating direction may be computed using a diagonal overlay measurement algorithm (e.g., DAIM®) based on the second Moiré pattern.

Figure 13:
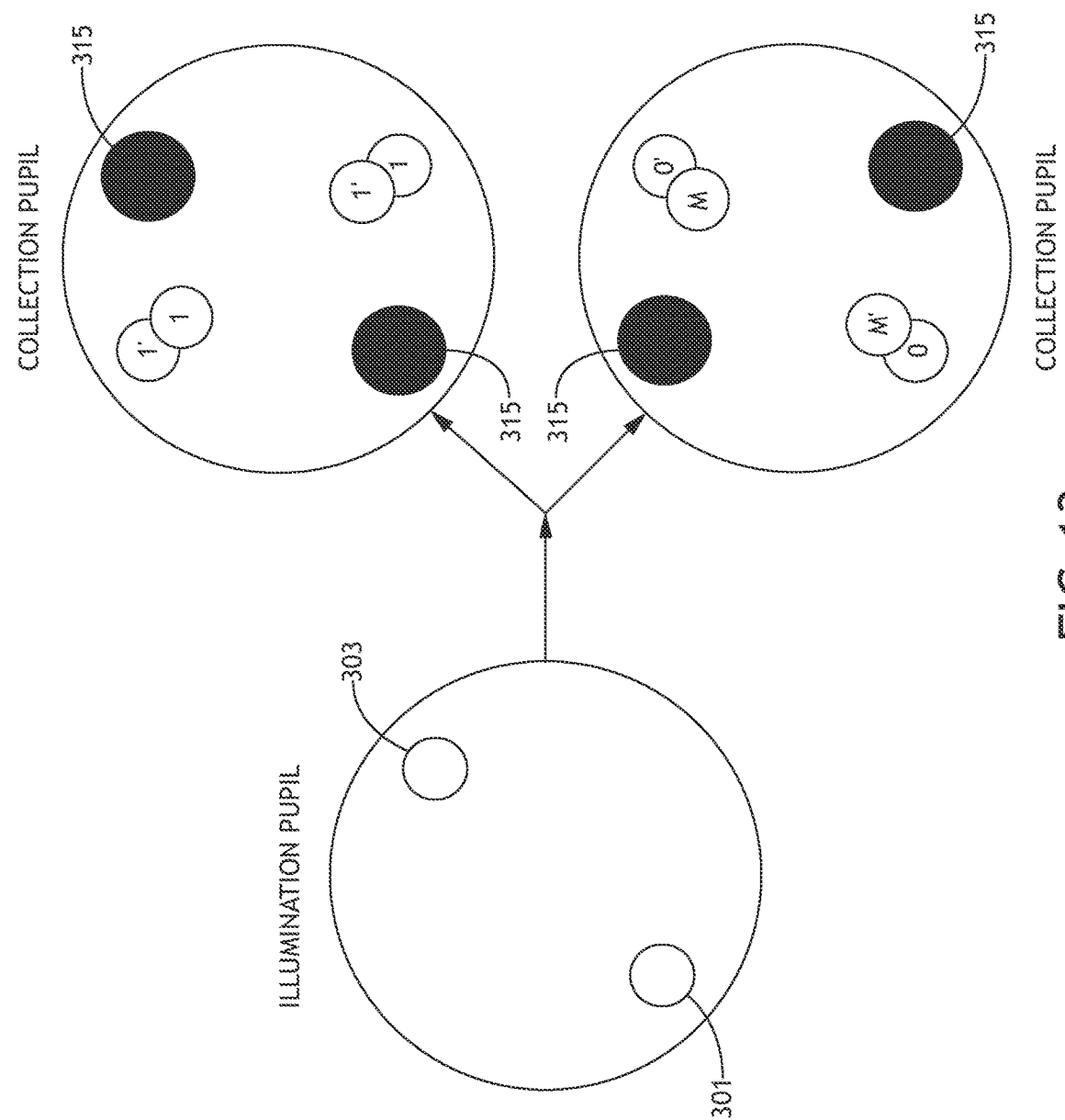
FIG. 13 illustrates an alternative one-step configuration for the steps shown in FIGS. 8A-8D, in accordance with one or more embodiments of the present disclosure.

FIG. 13 shows an alternative configuration of FIGS. 11A and 12. In this embodiment, a pupil-plane splitter (e.g., a pupil mask) may split the light at the collection pupil into two separate first and second detectors 104. The pupil-plane splitter may be configured to direct light in a first pair of opposing quadrants of the collection pupil along a first measurement path (including light forming the first image as shown in the image plane of FIG. 11A) and to direct light in a second pair of opposing quadrants of the collection pupil along a second measurement path (including light forming the second image as shown in the image plane of FIG. 12). The first detector 108 may be located at a field plane along the first measurement path and the second detector 108 may be located at a field plane along the second measurement path. In some embodiments, the pupil-plane splitter may comprise a prism that splits the light from each pair of opposing quadrants of the collection pupil into the first measurement path and the second measurement path. In some embodiments, as depicted in FIG. 13, the splitter may comprise a beamsplitter that directs the light from all of the quadrants to a first collection pupil for the first detector 104 and a second collection pupil for the second detector 104. If using a beamsplitter, a first pupil mask 315 may then be used to pass the appropriate diffraction orders through the first collection pupil (e.g., first-order diffraction beams along the X-direction and Y-direction) and a second pupil mask 315 may be used to pass the appropriate diffraction orders at the second collection pupil (e.g., Moiré diffraction orders and 0-order diffraction).

Illumination lobes 301 and 303 may illuminate the hatched overlay target of the sample 102 (e.g., sample layers 201 and 202) along the first diagonal direction. The first-direction gratings may diffract the illumination lobe 301 and generate a first-order diffraction beam along the first direction. The second-direction gratings may diffract the illumination lobe 301 and generate a first-order diffraction beam along the second direction. The first-direction gratings may diffract the illumination lobe 303 and generate a first-order diffraction beam along the first direction. The second-direction gratings may diffract the illumination lobe 303 and generate a first-order diffraction beam along the second direction. The hatched overlay target may diffract the illumination lobe 301 and generate a Moiré diffraction order and 0-order diffraction. The hatched overlay target may diffract the illumination lobe 303 and generate a Moiré diffraction order and 0-order diffraction.

The first-order diffraction beams along the first and second directions may be selectively passed through the first collection pupil by a first adjustable pupil mask 315. The first detector 104 at a field plane (e.g., conjugate to the sample 102) may generate a first image based on the diffraction orders passed through the collection pupil. A first Moiré pattern along a first Moiré grating direction may appear in the first image in locations of the first and second sets cells (see, e.g., the image plane). An overlay measurement (denoted O12) along the first Moiré grating direction (different from the X-direction and the Y-direction) may be computed using a diagonal overlay measurement algorithm (e.g., DAIM®) based on the first Moiré pattern.

The Moiré diffraction orders and 0-order diffraction may be selectively passed through the second collection pupil by a second adjustable pupil mask 315. The second detector 104 at a field plane (e.g., conjugate to the sample 102) may generate a second image based on the diffraction orders passed through the collection pupil. A second Moiré pattern along a second Moiré grating direction may appear in the second image in locations of the first and second sets of cells (see, e.g., the image plane). An overlay measurement (denoted O34) along a second Moiré grating direction may be computed using a diagonal overlay measurement algorithm (e.g., DAIM®) based on the second Moiré pattern.

It is further contemplated herein that the pupil-splitting techniques illustrated in FIG. 13 may further be applied in the context of FIGS. 8A, 8B, 10, and 10B. In this regard, the images in FIGS. 8A and 10A may be captured simultaneously and the images in FIGS. 8B and 10B may be captured simultaneously.

It is noted that the observed features shown in the image planes of FIGS. 3-12 may be substantially different in appearance from the features physically present on the sample 102. For example, the image planes of FIGS. 8A-12 may depict diagonal gratings even though the hatched overlay target of the sample 102 may not include diagonal gratings. Thus, the periodicity and angle of the apparent features shown in the generated images may vary depending on which diffraction orders are collected (in other words, the same hatched overlay target may produce different images).

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:
1. A metrology system comprising:
an illumination sub-system configured to direct an illumination lobe from an illumination source to a hatched overlay target on a sample at a normal incidence angle, wherein the hatched overlay target includes first-direction gratings having a periodicity along a first direction and second-direction gratings having a periodicity along a second direction different than the first direction, wherein the hatched overlay target comprises:
a first set of cells, each including at least one of the first-direction gratings in a first layer of the sample and at least one of the second-direction gratings in a second layer of the sample overlapping the first-direction gratings; and
a second set of cells, each including at least one of the second-direction gratings in the first layer of the sample and at least one of the first-direction gratings in the second layer of the sample overlapping the second-direction gratings;

an imaging sub-system comprising:
- a pupil mask located in a pupil plane, wherein a first configuration of the pupil mask passes first-order diffraction along the first direction and blocks non-zero diffraction along the second direction; and
- a detector located at a field plane configured to image the hatched overlay target based on diffraction orders passed by the pupil mask;

a controller communicatively couplable to the imaging sub-system, the controller including one or more processors configured to execute program instructions causing the one or more processors to:
- direct the pupil mask to configure according to the first configuration;
- receive a first-direction image of hatched overlay target from the detector based on the diffraction orders passed by the pupil mask in the first configuration, wherein the first-direction gratings are at least partially resolved and the second-direction gratings are unresolved in the first-direction image; and
- determine an overlay measurement associated with the relative positions of the first and second layers of the sample along the first direction based on the first-direction image.

2. The metrology system of claim 1, wherein the first configuration of the pupil mask blocks second-order diffraction and higher along the first direction.

3. The metrology system of claim 1, wherein the first configuration of the pupil mask passes 0-order diffraction.

4. The metrology system of claim 1, wherein the first configuration of the pupil mask blocks 0-order diffraction.

5. The metrology system of claim 1, wherein a second configuration of the pupil mask passes first-order diffraction along the second direction and blocks first-order diffraction along the first direction, wherein the one or more processors are further configured to execute program instructions causing the one or more processors to:
- direct the pupil mask to configure according to the second configuration;
- receive a second-direction image of hatched overlay target from the detector based on the diffraction orders passed by the pupil mask in the second configuration, wherein the second-direction gratings are at least partially resolved and the first-direction gratings are unresolved in the second-direction image; and
- determine an overlay measurement associated with the relative positions of the first and second layers of the sample along the second direction based on the second-direction image.

6. The metrology system of claim 5, wherein the second configuration of the pupil mask blocks second-order diffraction and higher along the second direction.

7. The metrology system of claim 5, wherein the second configuration of the pupil mask passes 0-order diffraction.

8. The metrology system of claim 5, wherein the second configuration of the pupil mask blocks 0-order diffraction.

9. The metrology system of claim 1, wherein the first and second directions are orthogonal.

10. The metrology system of claim 1, wherein the first and second direction gratings have a common period.

11. The metrology system of claim 1, wherein the first and second direction gratings have different periods.

12. The metrology system of claim 1, wherein first-direction gratings on the first layer of the sample and first-direction gratings on the second layer of the sample have a common period.

13. The metrology system of claim 1, wherein second-direction gratings on the first layer of the sample and second-direction gratings on the second layer of the sample have a common period.

14. A metrology system comprising:
an illumination sub-system configured to selectively direct illumination from an illumination source to a hatched overlay target on a sample, wherein the hatched overlay target includes first-direction gratings having a periodicity along a first direction and second-direction gratings having a periodicity along a second direction different than the first direction, wherein the illumination includes at least one illumination lobe oriented to illuminate the sample at an oblique angle, wherein the hatched overlay target comprises:
- a first set of cells, each including at least one of the first-direction gratings in a first layer of the sample and at least one of the second-direction gratings in a second layer of the sample overlapping the first-direction gratings; and
- a second set of cells, each including at least one of the second-direction gratings in the first layer of the sample and at least one of the first-direction gratings in the second layer of the sample overlapping the second-direction gratings;

an imaging sub-system including a detector located at a field plane configured to image the hatched overlay target;

a controller communicatively couplable to the imaging sub-system, the controller including one or more processors configured to execute program instructions causing the one or more processors to:
- receive one or more first-direction images of the hatched overlay target based on two symmetrically-opposed illumination lobes along the first direction from the illumination source, wherein a collection pupil of the imaging sub-system includes 0-order diffraction and a first-order diffraction beam from each of the two symmetrically-opposed illumination lobes along the first direction, wherein non-zero diffraction along the second direction is outside the collection pupil, wherein the first-direction gratings are at least partially resolved and the second-direction gratings are unresolved in the one or more first-direction images; and
- determine an overlay measurement associated with the relative positions of the first and second layers of the sample along the first direction based on the one or more first-direction images.

15. The metrology system of claim 14, wherein second-order diffraction and higher along the first direction is outside the collection pupil when the hatched overlay target is illuminated by the two symmetrically-opposed illumination lobes along the first direction.

16. The metrology system of claim 14, wherein the illumination sub-system illuminates the hatched overlay target with the two symmetrically-opposed illumination lobes along the first direction simultaneously, wherein the one or more first-direction images comprises a single first-direction image.

17. The metrology system of claim 14, wherein the illumination sub-system illuminates the hatched overlay target with the two symmetrically-opposed illumination lobes along the first direction sequentially, wherein the one or more first-direction images comprises two first-direction images, wherein a first of the two first-direction images is based on one of the two symmetrically-opposed illumination lobes along the first direction, wherein a second of the two first-direction images is based on another of the two symmetrically-opposed illumination lobes along the second direction.

18. The metrology system of claim 17, wherein determine an overlay measurement associated with the relative positions of the first and second layers of the sample along the first direction based on the one or more first-direction images comprises averaging overlay measurements associated with each of the two first-direction images.

19. The metrology system of claim 14, wherein the imaging sub-system further comprises a pupil mask located at a pupil plane of the collection pupil configured to pass the 0-order diffraction and the first-order diffraction beam from each of the two symmetrically-opposed illumination lobes along the first direction and block the non-zero diffraction along the second direction.

20. The metrology system of claim 14, wherein the one or more processors are further configured to execute program instructions causing the one or more processors to:
receive one or more second-direction images of the hatched overlay target based on two symmetrically-opposed illumination lobes along the second direction from the illumination source, wherein the collection pupil of the imaging sub-system includes 0-order diffraction and a first-order diffraction beam from each of the two symmetrically-opposed illumination lobes along the second direction, wherein non-zero diffraction along the first direction is outside the collection pupil, wherein the second-direction gratings are at least partially resolved and the first-direction gratings are unresolved in the one or more second-direction images; and
determine an overlay measurement associated with the relative positions of the first and second layers of the sample along the second direction based on the one or more second-direction images.

21. The metrology system of claim 20, wherein second-order diffraction and higher along the second direction is outside the collection pupil when the hatched overlay target is illuminated by the two symmetrically-opposed illumination lobes along the second direction.

22. The metrology system of claim 20, wherein the illumination sub-system illuminates the hatched overlay target with the two symmetrically-opposed illumination lobes along the second direction simultaneously, wherein the one or more second-direction images comprises a single second-direction image.

23. The metrology system of claim 20, wherein the illumination sub-system illuminates the hatched overlay target with the two symmetrically-opposed illumination lobes along the second direction sequentially, wherein the one or more second-direction images comprises two second-direction images, wherein a first of the two second-direction images is based on one of the two symmetrically-opposed illumination lobes along the second direction, wherein a second of the two second-direction images is based on another of the two symmetrically-opposed illumination lobes along the second direction.

24. The metrology system of claim 23, wherein determine an overlay measurement associated with the relative positions of the first and second layers of the sample along the second direction based on the one or more second-direction images comprises averaging overlay measurements associated with each of the two second-direction images.

25. The metrology system of claim 20, comprising a pupil mask located at a pupil plane of the collection pupil configured to pass 0-order diffraction and a first-order diffraction beam from each of the two symmetrically-opposed illumination lobes along the second direction and block non-zero diffraction along the first direction.

26. The metrology system of claim 20, wherein the imaging sub-system further comprises a pupil mask located at a pupil plane of the collection pupil configured to pass the 0-order diffraction and the first-order diffraction beam from each of the two symmetrically-opposed illumination lobes along the second direction and block the non-zero diffraction along the first direction.

27. The metrology system of claim 14, wherein the first and second directions are orthogonal.

28. The metrology system of claim 14, wherein the first and second direction gratings have a common period.

29. The metrology system of claim 14, wherein the first and second direction gratings have different periods.

30. The metrology system of claim 14, wherein first-direction gratings on the first layer of the sample and first-direction gratings on the second layer of the sample have a common period.

31. The metrology system of claim 14, wherein second-direction gratings on the first layer of the sample and second-direction gratings on the second layer of the sample have a common period.

32. A metrology system comprising:
an illumination sub-system configured to selectively direct illumination from an illumination source to a hatched overlay target on a sample, wherein the hatched overlay target includes first-direction gratings having a periodicity along a first direction and second-direction gratings having a periodicity along a second direction different than the first direction, wherein the illumination includes at least one illumination lobe oriented to illuminate the sample along at least one direction different than the first or second directions at an oblique angle, wherein the hatched overlay target comprises:
a first set of cells, each including at least one of the first-direction gratings in a first layer of the sample and at least one of the second-direction gratings in a second layer of the sample overlapping the first-direction gratings; and
a second set of cells, each including at least one of the second-direction gratings in the first layer of the sample and at least one of the first-direction gratings in the second layer of the sample overlapping the second-direction gratings;
a detector located at a field plane to image the hatched overlay target;
a pupil mask configured to pass selected diffraction orders associated with diffraction of the illumination by the hatched overlay target, wherein images of the hatched overlay target generated by the detector based on the selected diffraction orders include Moiré patterns in locations of the first and second sets of cells that are periodic along one or more Moiré grating directions different than the first or second directions; and
a controller communicatively couplable to the detector and the pupil mask, the controller including one or more processors configured to execute program instructions causing the one or more processors to determine overlay measurements associated with relative positions of the first and second layers of the sample along the first and second directions based on the Moiré patterns in one or more images of the hatched overlay target.

33. The metrology system of claim 32, wherein the at least one illumination lobe comprises four illumination lobes, wherein the illumination sub-system sequentially illuminates the hatched overlay target with the four illumination lobes, wherein the four illumination lobes include a first illumination lobe and a second illumination lobe opposite the first illumination lobe along a first diagonal direction different than the first and second directions, wherein the four illumination lobes further include a third illumination lobe and a fourth illumination lobe opposite the third illumination lobe along a second diagonal direction different than the first diagonal direction.

34. The metrology system of claim 33, wherein the one or more images of the hatched overlay target include:
a first image of the hatched overlay target based on the first illumination lobe, wherein the pupil mask is configured to selectively pass a first-order diffraction beam along the first direction generated by the first-direction gratings and a first-order diffraction beam along the second direction generated by the second-direction gratings;
a second image of the hatched overlay target based on the second illumination lobe, wherein the pupil mask is configured to selectively pass a first-order diffraction beam along the first direction generated by the first-direction gratings and a first-order diffraction beam along the second direction generated by the second-direction gratings,
wherein the Moiré patterns in locations of the first and second sets of cells in the first and second images are periodic along a first Moiré grating direction different than the first or second directions;
a third image of the hatched overlay target based on the third illumination lobe, wherein the pupil mask is configured to selectively pass a first-order diffraction beam along the first direction generated by the first-direction gratings and a first-order diffraction beam along the second direction generated by the second-direction gratings; and
a fourth image of the hatched overlay target based on the fourth illumination lobe, wherein the pupil mask is configured to selectively pass a first-order diffraction beam along the first direction generated by the first-direction gratings and a first-order diffraction beam along the second direction generated by the second-direction gratings,
wherein the Moiré patterns in locations of the first and second sets of cells in the third and fourth images are periodic along a second Moiré grating direction different than the first or second directions and different than the first Moiré grating direction.

35. The metrology system of claim 34, wherein determine overlay measurements associated with relative positions of the first and second layers of the sample along the first and second directions based on the Moiré patterns in one or more images of the hatched overlay target comprises:
generating an overlay measurement along the first Moiré grating direction based on the first and second images;
generating an overlay measurement along the second Moiré grating direction based on the third and fourth images; and
generating overlay measurements along the first and second directions on the sample based on the overlay measurements along the first and second Moiré grating directions.

36. The metrology system of claim 34, wherein determine overlay measurements associated with relative positions of the first and second layers of the sample along the first and second directions based on the Moiré patterns in one or more images of the hatched overlay target comprises:
generating an overlay measurement along the first Moiré grating direction by averaging overlay measurements along the first Moiré grating direction based on the first and second images;
generating an overlay measurement along the second Moiré grating direction by averaging overlay measurements along the second Moiré grating direction based on the third and fourth images;
generating an overlay measurement along a combined direction based on a linear combination of the overlay measurements along the first and second directions; and
generating overlay measurements along the first and second directions on the sample based on projections of the overlay measurement along the combined direction to the first and second directions.

37. The metrology system of claim 32, wherein the at least one illumination lobe comprises two illumination lobes,
wherein the illumination sub-system sequentially illuminates the hatched overlay target with the two illumination lobes,
wherein the two illumination lobes include a first illumination lobe and a second illumination lobe opposite the first illumination lobe along a diagonal direction different than the first and second directions.

38. The metrology system of claim 37, wherein the one or more images of the hatched overlay target include:
a first image of the hatched overlay target based on the first illumination lobe, wherein the pupil mask is configured to selectively pass a first-order diffraction beam along the first direction generated by the first-direction gratings and a first-order diffraction beam along the second direction generated by the second-direction gratings, wherein the Moiré patterns in locations of the first and second sets of cells are periodic along a first Moiré grating direction different than the first or second directions;
a second image of the hatched overlay target based on the first illumination lobe, wherein the pupil mask is configured to selectively pass 0-order diffraction and a Moiré diffraction order, wherein the Moiré patterns in locations of the first and second sets of cells are periodic along a second Moiré grating direction different than the first or second directions and different than the first Moiré grating direction;
a third image of the hatched overlay target based on the second illumination lobe, wherein the pupil mask is configured to selectively pass a first-order diffraction beam along the first direction generated by the first-direction gratings and a first-order diffraction beam along the second direction generated by the second-direction gratings, wherein the Moiré patterns in locations of the first and second sets of cells are periodic along the first Moiré grating direction; and
a fourth image of the hatched overlay target based on the second illumination lobe, wherein the pupil mask is configured to selectively pass 0-order diffraction and a Moiré diffraction order, wherein the Moiré patterns in locations of the first and second sets of cells are periodic along the second Moiré grating direction.

39. The metrology system of claim 38, wherein determine overlay measurements associated with relative positions of the first and second layers of the sample along the first and second directions based on the Moiré patterns in one or more images of the hatched overlay target comprises:

generating an overlay measurement along the first Moiré grating direction based on the first and third images;
generating an overlay measurement along the second Moiré grating direction based on the second and fourth images; and
generating overlay measurements along the first and second directions on the sample based on the overlay measurements along the first and second Moiré grating directions.

40. The metrology system of claim 38, wherein determine overlay measurements associated with relative positions of the first and second layers of the sample along the first and second directions based on the Moiré patterns in one or more images of the hatched overlay target comprises:
    generating an overlay measurement along the first Moiré grating direction by averaging overlay measurements along the first Moiré grating direction based on the first and third images;
    generating an overlay measurement along the second Moiré grating direction by averaging overlay measurements along the second Moiré grating direction based on the second and fourth images;
    generating an overlay measurement along a combined direction based on a linear combination of the overlay measurements along the first and second Moiré grating directions; and
    generating overlay measurements along the first and second directions on the sample based on projections of the overlay measurement along the combined direction to the first and second directions.

41. The metrology system of claim 37, wherein the first, second, third, and fourth images are generated sequentially on the detector.

42. The metrology system of claim 37, further comprising:
    a pupil-plane splitter configured to direct light in a first pair of opposing quadrants of the collection pupil including light forming the first and second images along a first measurement path and further configured to direct light in a second pair of opposing quadrants including light forming the third and fourth images along a second measurement path, wherein the detector is located in a field plane along the first measurement path, wherein an additional detector is located in an additional field plane along the second measurement path, wherein the first and second images are generated simultaneously on the first detector and the additional detector, wherein the third and fourth images are generated simultaneously on the first detector and the additional detector.

43. The metrology system of claim 32, wherein the at least one illumination lobe comprises four illumination lobes,
    wherein a first pair the four illumination lobes includes a first illumination lobe and a second illumination lobe opposite the first illumination lobe along a first diagonal direction different than the first and second directions,
    wherein a second pair of the four illumination lobes includes a third illumination lobe and a fourth illumination lobe opposite the third illumination lobe along a second diagonal direction different than the first diagonal direction, and
    wherein the illumination sub-system sequentially illuminates the hatched overlay target with the first pair of illumination lobes and the second pair of illumination lobes.

44. The metrology system of claim 43, wherein the one or more images of the hatched overlay target include:
    a first image of the hatched overlay target based on the first pair of illumination lobes, wherein the pupil mask is configured to selectively pass, for each of the first and second illumination lobes, a first-order diffraction beam along the first direction generated by the first-direction gratings and a first-order diffraction beam along the second direction generated by the second-direction gratings, wherein the Moiré patterns in locations of the first and second sets of cells in the first image are periodic along a first Moiré grating direction different than the first or second directions;
    a second image of the hatched overlay target based on the second pair of illumination lobes, wherein the pupil mask is configured to selectively pass, for each of the third and fourth illumination lobes, a first-order diffraction beam along the first direction generated by the first-direction gratings and a first-order diffraction beam along the second direction generated by the second-direction gratings, wherein the Moiré patterns in locations of the first and second sets of cells in the second image are periodic along a second Moiré grating direction different than the first or second directions and different than the first Moiré grating direction.

45. The metrology system of claim 44, wherein determine overlay measurements associated with relative positions of the first and second layers of the sample along the first and second directions based on the Moiré patterns in one or more images of the hatched overlay target comprises:
    generating an overlay measurement along the first Moiré grating direction based on the first image;
    generating an overlay measurement along the second Moiré grating direction based on the second image; and
    generating overlay measurements along the first and second directions on the sample based on the overlay measurements along the first and second Moiré grating directions.

46. The metrology system of claim 44, wherein determine overlay measurements associated with relative positions of the first and second layers of the sample along the first and second directions based on the Moiré patterns in one or more images of the hatched overlay target comprises:
    generating an overlay measurement along the first Moiré grating direction based on the first image;
    generating an overlay measurement along the second Moiré grating direction based on the second image;
    generating an overlay measurement along a combined direction based on a linear combination of the overlay measurements along the first and second Moiré grating directions; and
    generating overlay measurements along the first and second directions on the sample based on projections of the overlay measurement along the combined direction to the first and second directions.

47. The metrology system of claim 32, wherein the at least one illumination lobe comprises a first illumination lobe and a second illumination lobe opposite the first illumination lobe along a diagonal direction different than the first and second directions, wherein the illumination sub-system simultaneously illuminates the hatched overlay target with the two illumination lobes.

48. The metrology system of claim 47, wherein the one or more images of the hatched overlay target include:
    a first image of the hatched overlay target based on the first and second illumination lobes, wherein the pupil mask is configured to selectively pass, for each of the first and second illumination lobes, a first-order diffraction beam along the first direction generated by the first-direction gratings and a first-order diffraction beam along the second direction generated by the second-direction gratings, wherein the Moiré patterns in locations of the first and second sets of cells in the first image are periodic along a first Moiré grating direction different than the first or second directions;

a second image of the hatched overlay target based on the first and second illumination lobes, wherein the pupil mask is configured to selectively pass, for each of the first and second illumination lobes, 0-order diffraction and a Moiré diffraction order, wherein the Moiré patterns in locations of the first and second sets of cells in the second image are periodic along a second Moiré grating direction different than the first or second directions and different than the first Moiré grating direction.

49. The metrology system of claim 48, wherein determine overlay measurements associated with relative positions of the first and second layers of the sample along the first and second directions based on the Moiré patterns in one or more images of the hatched overlay target comprises:
generating an overlay measurement along the first Moiré grating direction based on the first image;
generating an overlay measurement along the second Moiré grating direction based on the second image; and
generating overlay measurements along the first and second directions on the sample based on the overlay measurements along the first and second Moiré grating directions.

50. The metrology system of claim 48, wherein determine overlay measurements associated with relative positions of the first and second layers of the sample along the first and second directions based on the Moiré patterns in one or more images of the hatched overlay target comprises:
generating an overlay measurement along the first Moiré grating direction based on the first image;
generating an overlay measurement along the second Moiré grating direction based on the second image;
generating an overlay measurement along a combined direction based on a linear combination of the overlay measurements along the first and second Moiré grating directions; and
generating overlay measurements along the first and second directions on the sample based on projections of the overlay measurement along the combined direction to the first and second directions.

51. The metrology system of claim 47, wherein the first and second images are generated sequentially on the detector.

52. The metrology system of claim 47, further comprising:
a pupil-plane splitter configured to direct light in a first pair of opposing quadrants of the collection pupil including light forming the first image along a first measurement path and further configured to direct light in a second pair of opposing quadrants including light forming the second image along a second measurement path, wherein the detector is located in a field plane along the first measurement path, wherein an additional detector is located in an additional field plane along the second measurement path, wherein the first and second images are generated simultaneously on the first detector and the additional detector.

53. The metrology system of claim 32, wherein the first and second directions are orthogonal.

54. The metrology system of claim 32, wherein the first and second direction gratings have a common period.

55. The metrology system of claim 32, wherein the first and second direction gratings have different periods.

56. The metrology system of claim 32, wherein first-direction gratings on the first layer of the sample and first-direction gratings on the second layer of the sample have a common period.

57. The metrology system of claim 32, wherein second-direction gratings on the first layer of the sample and second-direction gratings on the second layer of the sample have a common period.

* * * * *